United States Patent
Lu et al.

(10) Patent No.: US 10,796,987 B2
(45) Date of Patent: Oct. 6, 2020

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Wen-Long Lu, Kaohsiung (TW); Huang-Hsien Chang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/182,588

(22) Filed: Nov. 6, 2018

(65) Prior Publication Data
US 2020/0144168 A1   May 7, 2020

(51) Int. Cl.
| | |
|---|---|
| H01L 23/12 | (2006.01) |
| H01L 23/48 | (2006.01) |
| H01L 21/00 | (2006.01) |
| H01L 21/44 | (2006.01) |
| H01L 23/498 | (2006.01) |
| H01L 23/31 | (2006.01) |
| H01L 23/00 | (2006.01) |
| H01L 21/48 | (2006.01) |

(52) U.S. Cl.
CPC .... H01L 23/49822 (2013.01); H01L 21/4857 (2013.01); H01L 23/3192 (2013.01); H01L 24/17 (2013.01); H01L 24/81 (2013.01); *H01L 2924/1517* (2013.01); *H01L 2924/15159* (2013.01)

(58) Field of Classification Search
CPC ............. H01L 21/563; H01L 23/49822; H01L 21/4857; H01L 23/3192; H01L 24/17; H01L 24/81; H01L 24/16; H01L 21/56
See application file for complete search history.

(56) References Cited

U.S. PATENT DOCUMENTS

| | | | |
|---|---|---|---|
| 7,846,619 B2 | 12/2010 | Han | |
| 8,193,637 B2 * | 6/2012 | Park | H01L 24/05 257/737 |
| 2002/0006718 A1 * | 1/2002 | Distefano | H01L 21/568 438/617 |
| 2008/0182360 A1 * | 7/2008 | Lin | H01L 21/568 438/108 |
| 2012/0229990 A1 * | 9/2012 | Adachi | H05K 3/4608 361/748 |
| 2013/0256881 A1 * | 10/2013 | Morifuji | H01L 24/81 257/737 |
| 2016/0066423 A1 | 3/2016 | Sakamoto et al. | |
| 2018/0174954 A1 | 6/2018 | Widjaja | |

* cited by examiner

*Primary Examiner* — Alonzo Chambliss
(74) *Attorney, Agent, or Firm* — Foley & Lardner LLP

(57) ABSTRACT

A semiconductor packaging device includes a first patterned insulation layer, a patterned conductive layer, a semiconductor device and an encapsulant. The first patterned insulation layer has a first surface, a second surface opposite the first surface, and an island portion having the first surface. The first patterned insulation layer defines a tapered groove surrounding the island portion. The patterned conductive layer is disposed on the first surface of the island portion. The semiconductor device electrically connects to the patterned conductive layer. The encapsulant encapsulates the semiconductor device, the first patterned insulation layer and the patterned conductive layer.

23 Claims, 29 Drawing Sheets

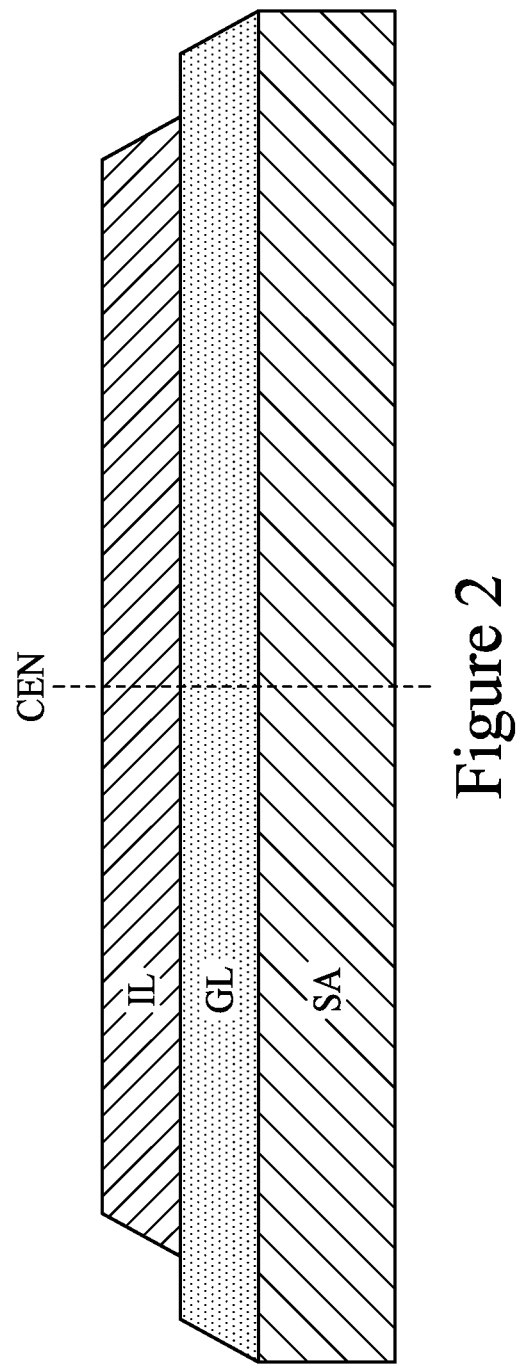

SEMICONDUCTOR DEVICE PACKAGE AND METHOD OF MANUFACTURING THE SAME

1. TECHNICAL FIELD

The present disclosure relates generally to a semiconductor device package and a method of manufacturing the same, and to a semiconductor device package including a barrier structure and a method of manufacturing the same.

2. DESCRIPTION OF THE RELATED ART

A semiconductor device package includes a semiconductor device, a patterned conductive layer electrically connected to the semiconductor device and a passivation/dielectric layer surrounding the patterned conductive layer.

During manufacturing of the semiconductor device package, a level/extent of contraction or shrinkage of the passivation/dielectric layer, which occurs during thermal cycles, may be correlated with a position/location of the dielectric layer. For example, the passivation/dielectric layer may have a relatively high level of contraction at or close to a position far from a geometrical center of the passivation/dielectric layer. Such phenomenon may result in warpage, which adversely affects performance of the semiconductor device package.

3. SUMMARY

In one or more embodiments, a semiconductor packaging device comprises: a first patterned insulation layer having a first surface, a second surface opposite the first surface, and an island portion having the first surface, the first patterned insulation layer defining a tapered groove surrounding the island portion; a patterned conductive layer disposed on the first surface of the island portion; a semiconductor device electrically connected to the patterned conductive layer; and an encapsulant encapsulating the semiconductor device, the first patterned insulation layer and the patterned conductive layer.

In one or more embodiments, a semiconductor packaging structure comprises an insulation island; an insulation wall adjacent to the insulation island; a patterned conductive layer on the insulation island; and a semiconductor device electrically connected to the patterned conductive layer.

In one or more embodiments, a method for forming a semiconductor package structure comprises providing a carrier; forming a seed layer on the carrier and patterning the seed layer; forming a patterned insulation layer to overlay part of the seed layer, forming an insulation wall of the patterned insulation layer adjacent to an insulation island of the patterned insulation layer; curing the patterned insulation layer, a tapered groove thereby being formed to surround the insulation island; forming a fine conductive structure on the insulation island and a conductive connection structure penetrating the patterned insulation layer; and arranging a semiconductor device on the connection structure electrically connected to the fine conductive structure.

4. BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 2 illustrates a cross-section of the shrinkage of an insulation layer over a large area substrate in a comparative process.

FIG. 12A, FIG. 12B, FIG. 12C, FIG. 12D, FIG. 12E, FIG. 12F, FIG. 12G, FIG. 12H, FIG. 12I, FIG. 12J, and FIG. 12K illustrate a method of manufacturing a semiconductor device package in accordance with some embodiments of the present disclosure.

Figure 13B:
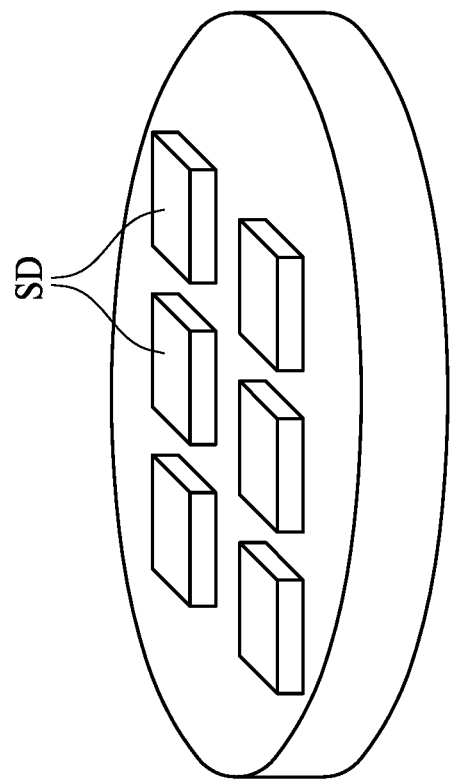
Figure 13A:
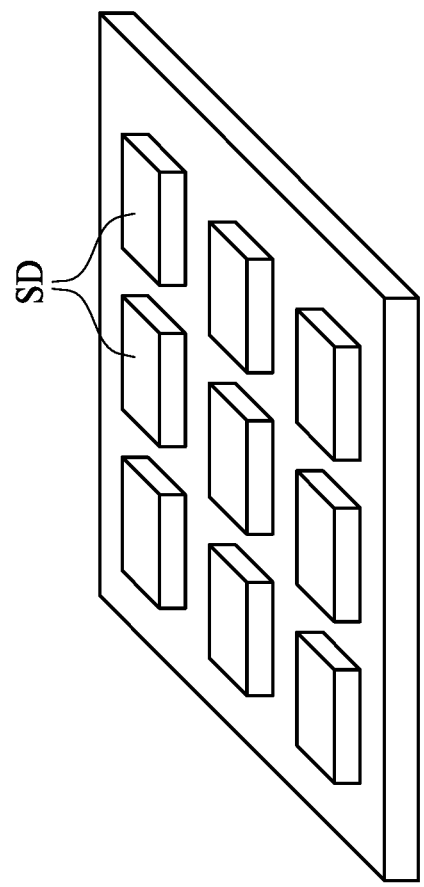

FIG. 13A illustrates semiconductor device packages in accordance with some embodiments of the present disclosure.

FIG. 13B illustrates semiconductor device packages in accordance with some embodiments of the present disclosure.

Common reference numerals are used throughout the drawings and the detailed description to indicate the same or similar elements. The present disclosure will be readily understood from the following detailed description taken in conjunction with the accompanying drawings.

DETAILED DESCRIPTION

Figure 1:
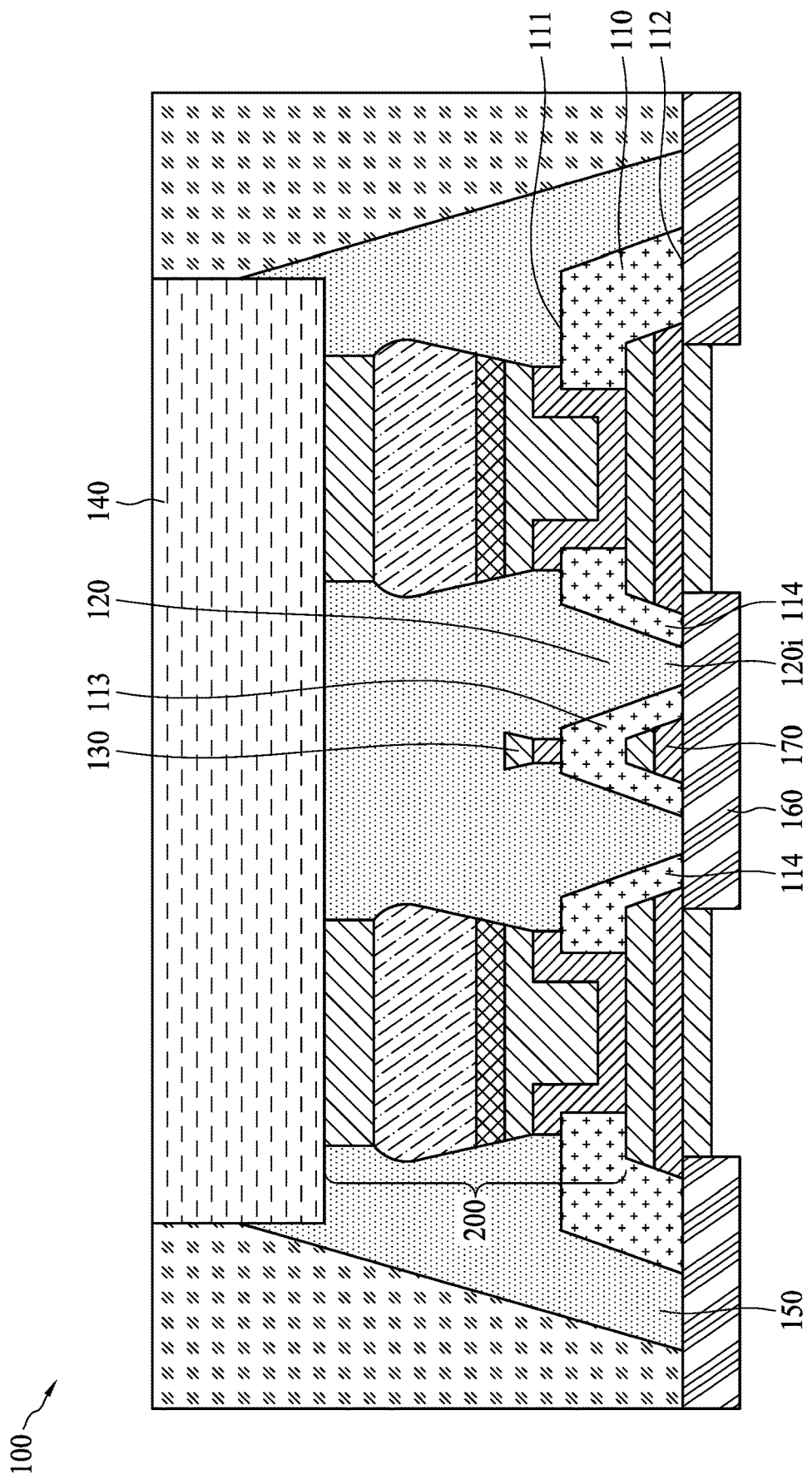
FIG. 1 illustrates a cross-sectional view of a semiconductor device package in accordance with some embodiments of the present disclosure.

FIG. 1 illustrates a cross-sectional view of a semiconductor device package 100 in accordance with some embodiments of the present disclosure. The semiconductor device package 100 includes a patterned insulation layer 110, a patterned conductive layer (also referred to as a fine conductive structure) 130, a semiconductor device 140, and an encapsulant 150.

The first patterned insulation layer 110 has a surface 111 and a surface 112 opposite the surface 111. The patterned insulation layer 110 has an island portion (also referred to as an insulation island) 113 having the surface 111. A tapered groove 120 surrounds the island portion 113. In some embodiments, the insulation layer 110 comprises an insulation wall 114 adjacent to the insulation island 113. The patterned conductive layer 130 is disposed on the surface 111 of the insulation island 113. The semiconductor device 140 electrically connects to the patterned conductive layer 130. In some embodiments, the encapsulant 150 encapsulates the semiconductor device 140, the patterned insulation layer 110 and the patterned conductive layer 130.

In some embodiments, the tapered groove 120 penetrates from the surface 111 of the patterned insulation layer 110 to the surface 112 of the patterned insulation layer 110. Each pattern of the patterned insulation layer 110 is separate from a neighboring one.

In some embodiments, the patterned insulation layer 110 may include, for example, one or more organic materials (e.g., a molding compound, bismaleimide triazine (BT), a PI, a polybenzoxazole (PBO), a solder resist, solder mask ink, an ABF, a polypropylene (PP), an epoxy-based photosensitive material, or a combination of two or more thereof), inorganic materials (e.g., silicon, $SiO_x$, $SiN_x$, $TaO_x$, glass, ceramic, quartz, or a combination of two or more thereof), a liquid-film material or a dry-film material, or a combination of two or more thereof. The patterned insulation layer 110 is formed by a suit deposition process, e.g. CVD, PVD, printing, plating, etc.

During manufacturing of the semiconductor device packaging, shrinkage of the insulation layer occurs after a curing process due to thermal cycles or UV emission processes. An amount of shrinkage relates to a position far from a geometrical center CEN of the patterned insulation layer. FIG. 2 illustrates a cross-section of the shrinkage of an insulation layer IL over a large area substrate SUB, e.g. a wafer, a panel, a strip, etc. in the comparative process. In some cases, a glue layer GL is arranged between the insulation layer IL and the large area substrate SUB. Significant shrinkage may occur at the edge of the insulation layer after the curing process, and the significant shrinkage results in an offset pattern. The shrinkage can reduce the yield of dies located at the edge of the large area substrate.

Figure 3A:
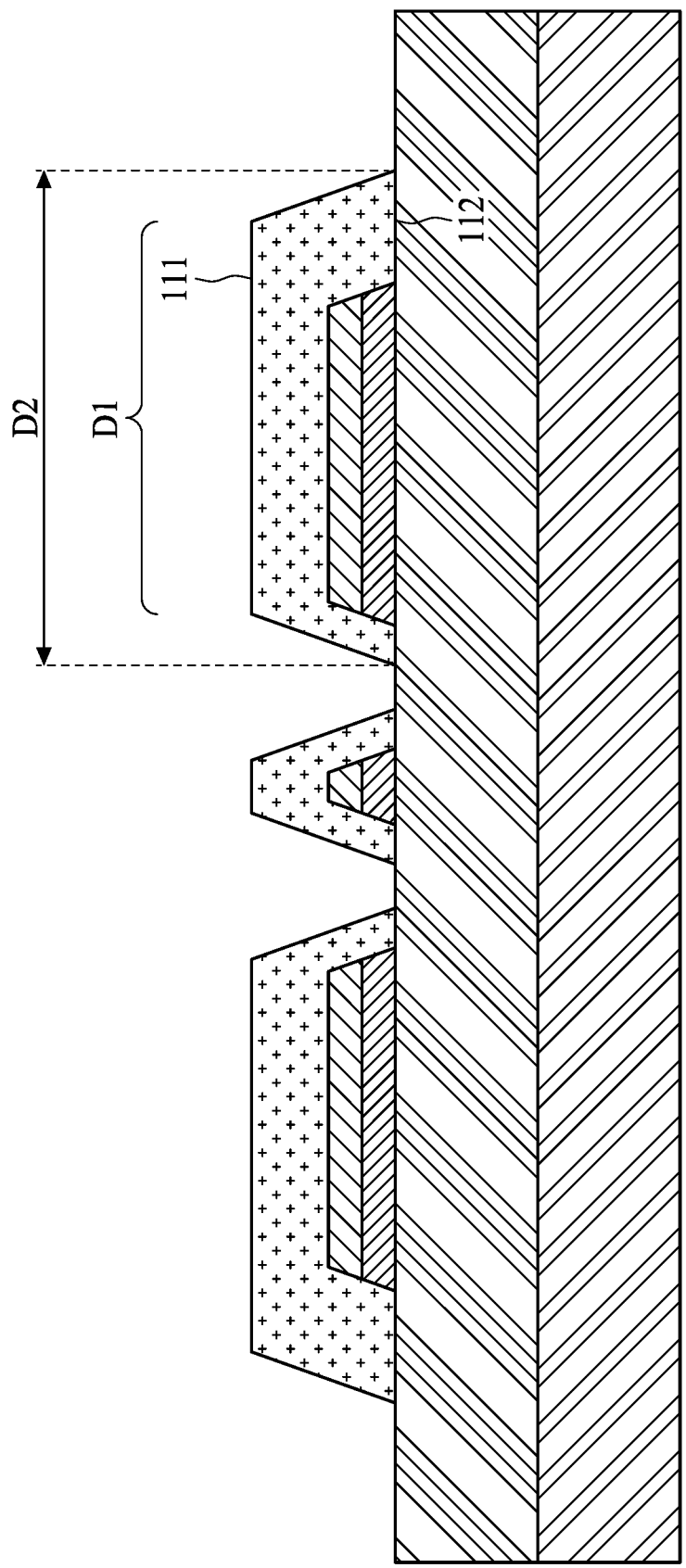
FIG. 3A illustrates a cross-sectional view of a portion of a semiconductor device package in accordance with some embodiments of the present disclosure.

FIG. 3A illustrates an enlarged view of a portion of the semiconductor device package 100. The surface 111 of the patterned insulation layer 110 has a dimension D1, and the surface 112 of the patterned insulation layer 110 has a dimension D2. The dimension D1 is smaller than the dimension D2. The insulation layer of the present disclosure is patterned so that each pattern has a respective dimension center, and a distance from an edge of each pattern to the center is reduced. The shrinkage amount of each insulation pattern (the difference between the dimension D1 and the dimension D2) can be well controlled. Therefore, no noticeable pattern offset occurs at the patterned insulation layer of the present disclosure.

Figure 3B:
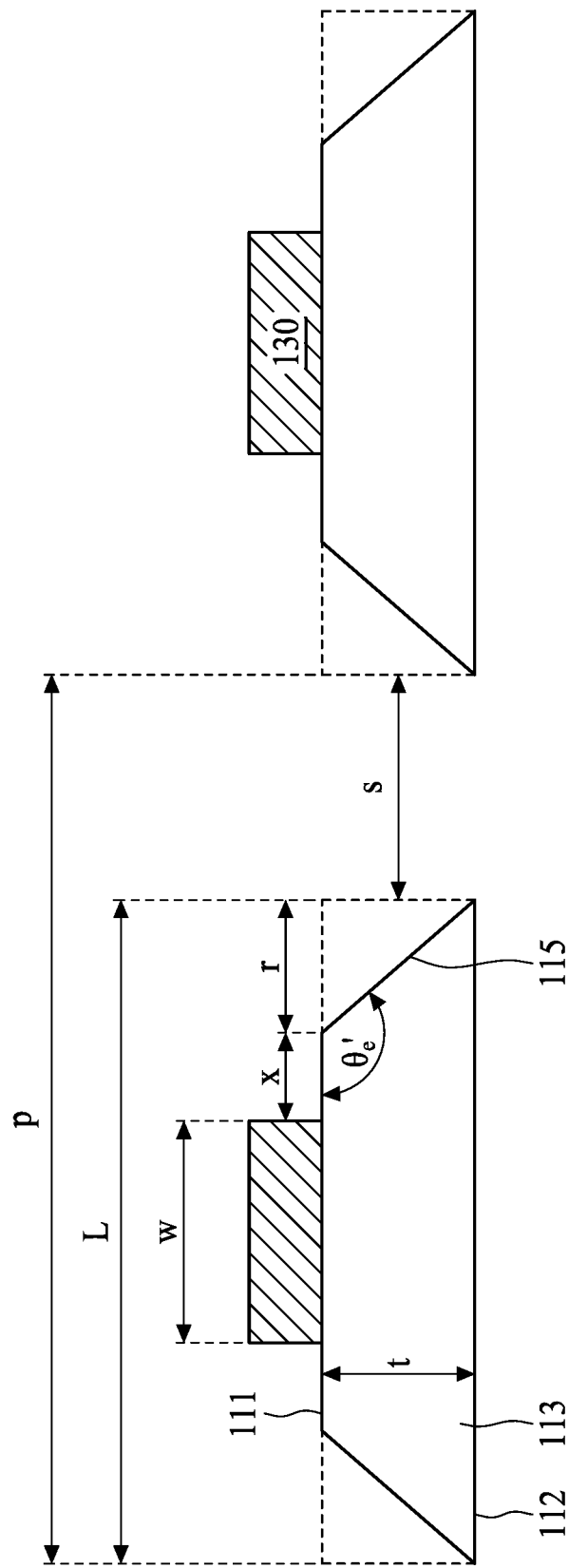
FIG. 3B illustrates an enlarged view of a portion of the semiconductor device package.

FIG. 3B illustrates an enlarged view of a portion of the semiconductor device package 100. The patterned conductive layer 130 disposed on the surface 111 of the island portion 113 has a width w, and a width x of the island portion of the first patterned insulation layer 110 is exposed to the encapsulant 150. A shrinkage r of the patterned insulation layer resulting from the curing process relates to the difference between the dimension D1 of the first surface 111 and the dimension D2 of the surface 112, as mentioned above. A shrinkage rate n % can be determined as follows:

$$\frac{(w+2x+2r)-(w+2x)}{(w+2x+2r)} = n\ \% \tag{1}$$

The shrinkage r can be determined as follows:

$$r=(L-(w+2x))/2, \tag{2}$$

wherein L refers to the pattern size.

Figure 4A:
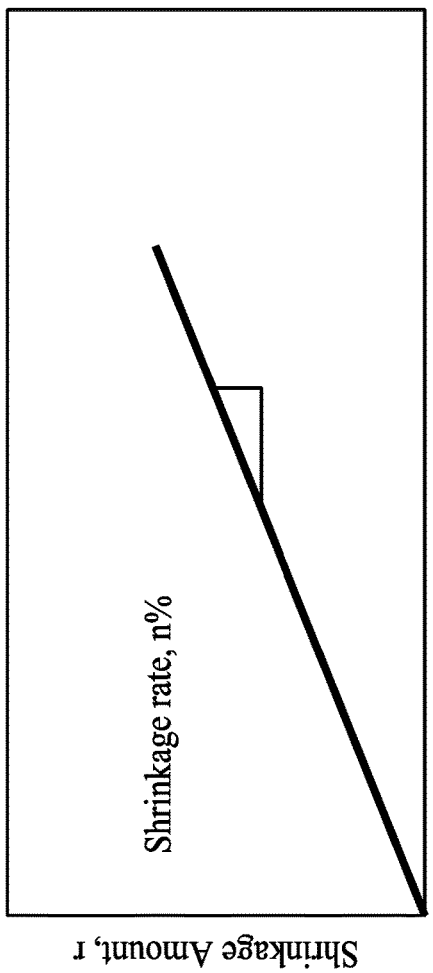
FIG. 4A illustrates the relationship between the shrinkage amount r and the pattern size L of the present disclosure.
Figure 4B:
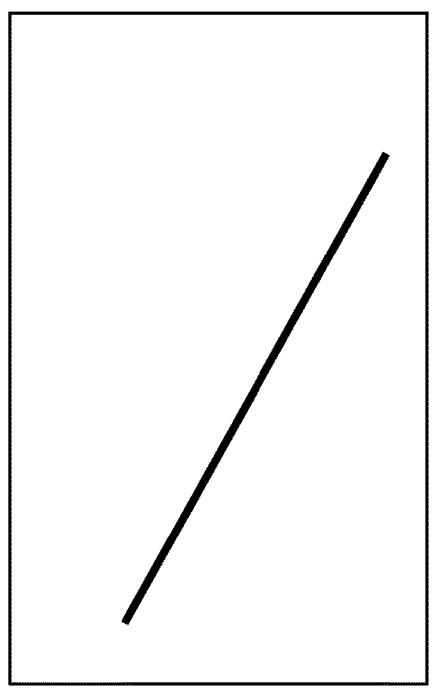
FIG. 4B illustrates the relationship between the shrinkage amount r and the first width w of the patterned conductive layer of the present disclosure.

FIG. 4A illustrates the shrinkage amount r is positively proportional to the pattern size L=w+2x+2r, as Equation (1). FIG. 4B illustrates the shrinkage amount r is negatively proportional to the width w of the patterned conductive layer 130, as Equation (2).

The patterned insulation layer 110 has the heat shrinkage rate n %. In some preferred embodiments, the heat shrinkage rate n % of the patterned insulation layer 110 is in the range of 80%-95%.

In some embodiments, the width w of the patterned conductive layer 130 is equal to or larger than 7 μm. The width x of the island portion of the patterned insulation layer 110 is equal to or larger than 0.2 μm. The shrinkage also relates to a thickness t of the insulation layer 110. In some embodiments, the thickness t of the insulation layer 110 is in a range from 5 μm to 20 μm.

A space between the insulation island 113 and the insulation wall adjacent to the insulation island 113, or a neighboring insulation island, defines the tapered groove. The dimension of the space is defined as s. The specified dimension of the space s depends on process capabilities, e.g. lithography techniques, mask pattern, coating, exposure, development, and light source resolution and/or depth of focus (DOF). In some embodiments, the specified dimension of the space s is in a range from 1 μm to 2 μm for fine pitch p<10 μm and the width x of the island portion 113 is in a range from 0.2 μm to 0.25 μm.

A predetermined pitch p can be described as follows:

$$p=L+s=w+2x+2r+s \tag{3}$$

The pitch p and the space s are predetermined. The relationship of the width w of the patterned conductive layer 130, the shrinkage amount r and the width x of the island portion can be described as follows:

$$p-2x-s=w+2r=\text{constant} \tag{4}$$

A relation equation can be derived from Equations (1) and (4) as follows:

$$2x = \frac{2r - w \cdot n\ \% - 2r \cdot n\ \%}{n\ \%} \tag{2}$$

Further, the relationship of the width w of the patterned conductive layer 130 and the shrinkage amount r can be described based on Equations (4) and (5):

$$p - \left(\frac{2r - w \cdot n\% - 2r \cdot n\%}{n\%}\right) - s = w + 2r \quad (6)$$

$$p - s = 2w + 2r(2 + 1/n\%)$$

Figure 5A:
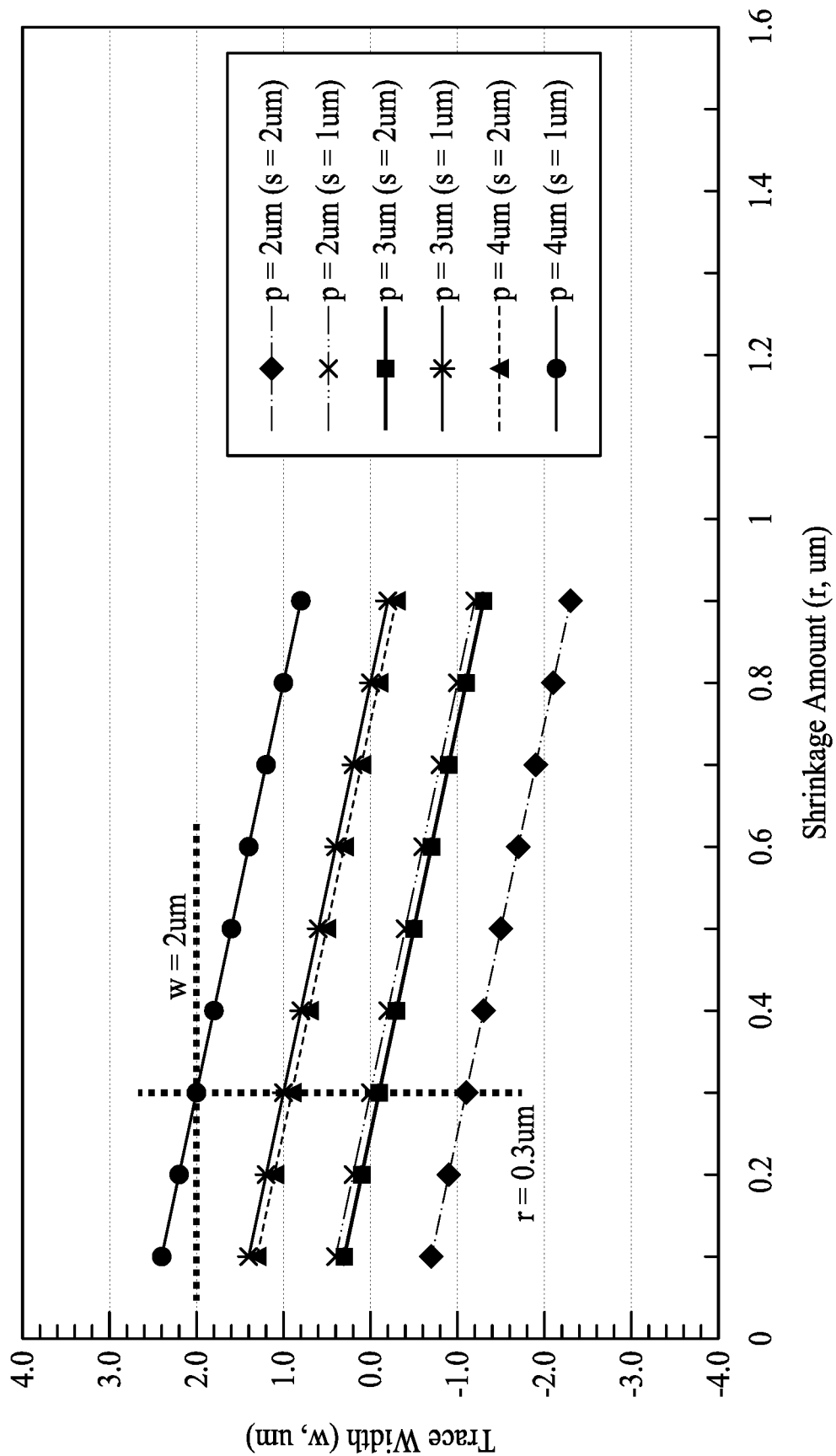
FIG. 5A shows the relationship of the first width w of the patterned conductive layer and the shrinkage amount r at different dimensions of predetermined pitch p of the present disclosure.

FIG. 5A shows the relationship of the width w of the patterned conductive layer 130 with respect to the shrinkage amount r at different dimensions of the predetermined pitch p. These lines indicate that a larger pitch results in a larger shrinkage amount.

Figure 5B:
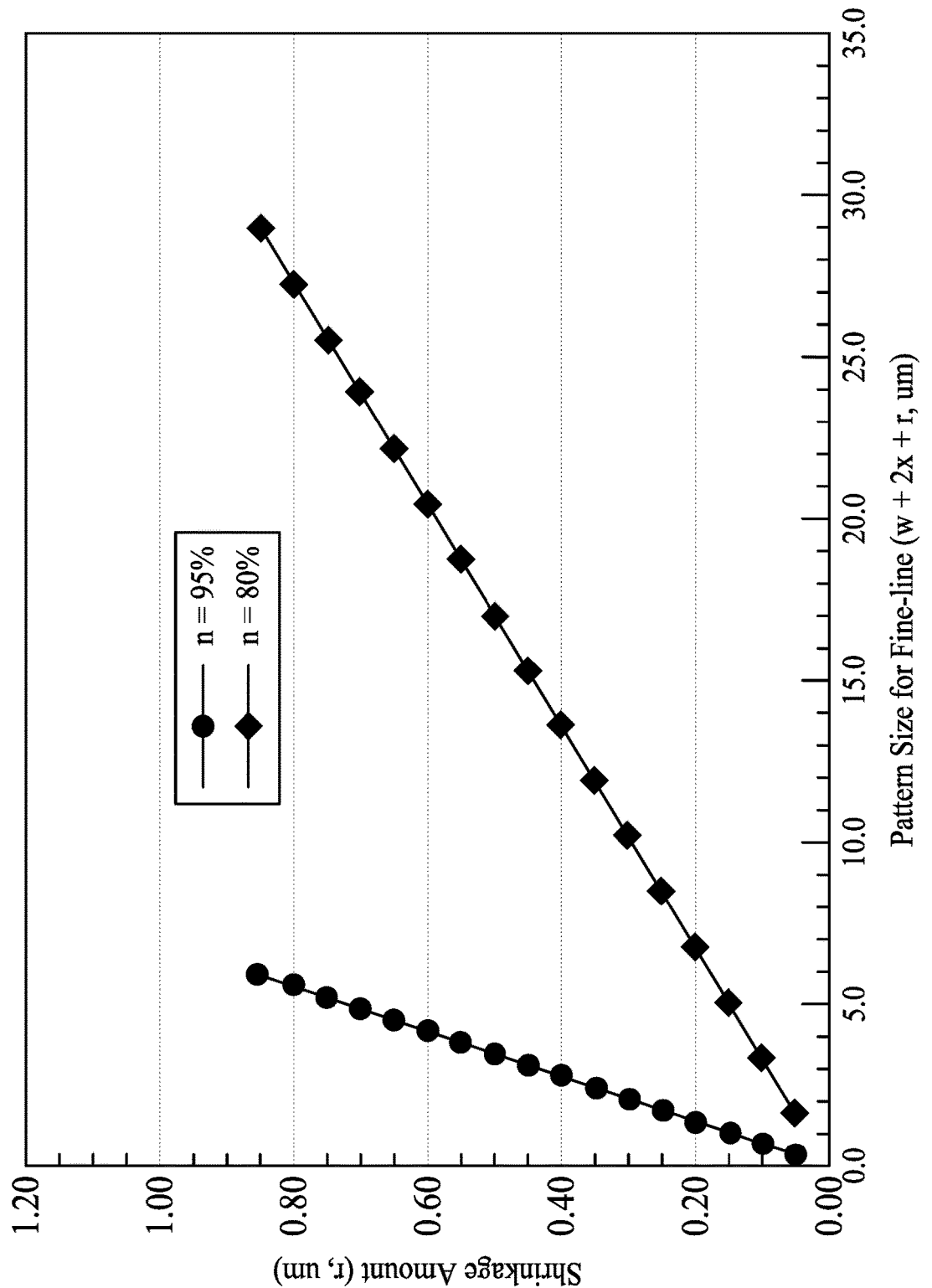
FIG. 5B shows the relationship of the shrinkage amount r with respect to the pattern size at different shrinkage rates n % of the present disclosure.

FIG. 5B shows the relationship of the shrinkage amount r with respect to the pattern size at different shrinkage rates n %. As the patterned size increases, the material having a smaller shrinkage rate n % is specified.

For example, referring to FIG. 5A, for a predetermined width w being 2 µm, the shrinkage amount r≤0.3 µm for a p≥4 µm and s≤1 µm is specified.

Referring to FIG. 3B, a shrinkage angle θe' is defined by the surface 111 and a sidewall 115 of the island portion 113. The shrinkage angle θe' is associated with the thickness t of the insulation layer, the shrinkage amount r, the pattern size L, the width x of the island portion and the width w of the conductive layer 130. The relationship between the parameters is described as follows:

$$\tan(\pi - \theta_e') = t/r$$

$$\theta_e' = \pi - \tan^{-1}(t/(L-(w+2x))/2) \quad (7)$$

According to Equation (7), when the thickness of the insulation layer is in a range from 5 µm to 10 µm, and the pitch size p is less than 10 the shrinkage angle θe' will be in a range from 90° to 150°.

In some embodiments, the tapered groove has the space s which is determined based on the following equation:

$$s \leq p - (w + 2x + 2r) \quad (8)$$

Each parameter and relation equation described in the present disclosure has tolerance in a manufacturing process, including the value of p−(w+2x+2r).

Figure 6:
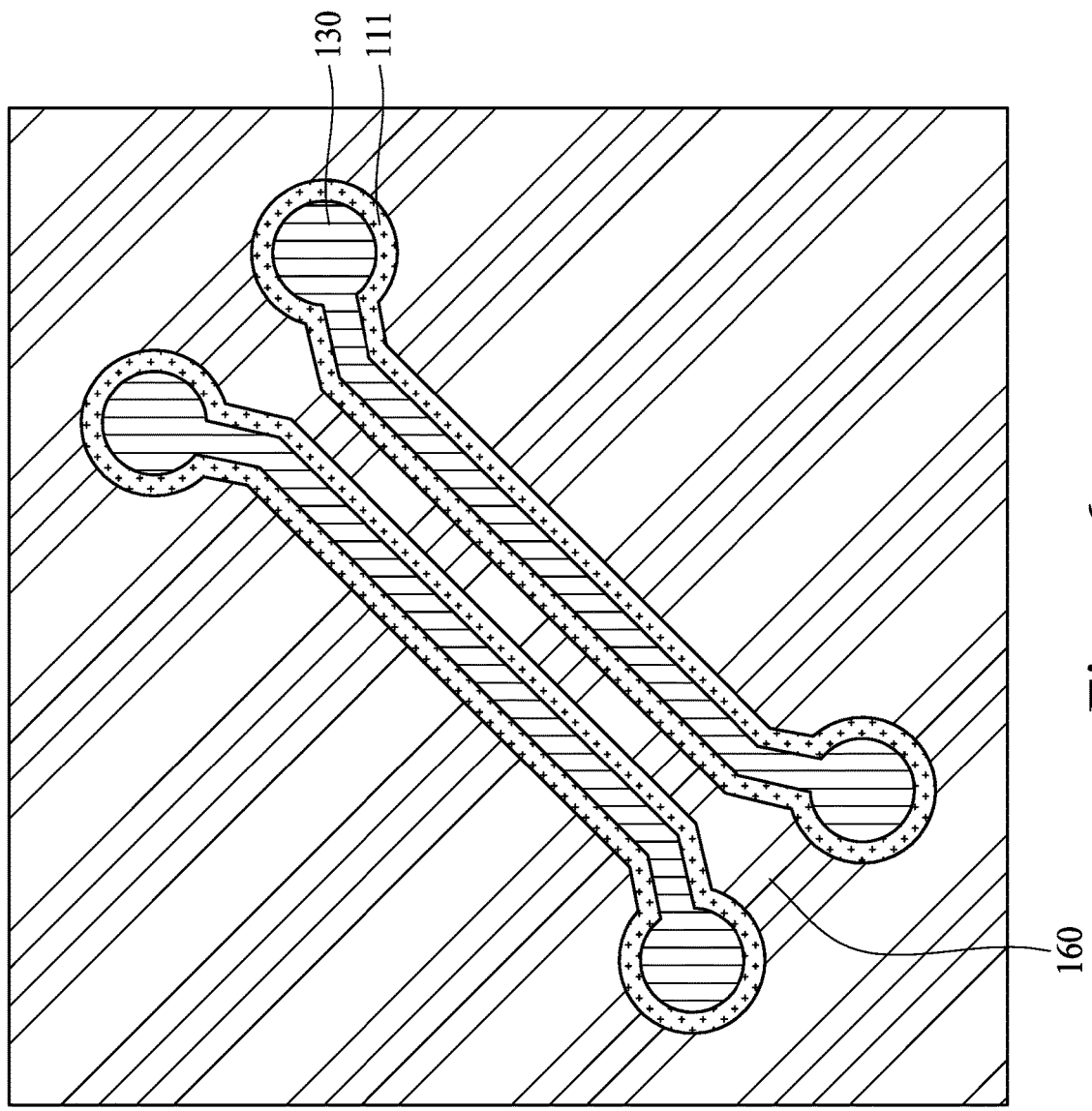
FIG. 6 illustrates a top view of a part of the semiconductor device package of FIG. 1.

In some embodiments, the tapered groove 120 surrounds the patterned conductive layer 130. FIG. 6 illustrates a top view of a part of the semiconductor device package 100 of FIG. 1 without the semiconductor device or the encapsulant. From the top view, the patterned conductive layer 130 is surrounded by the surface 111 of the insulation island 113 and the tapered groove and thus an upper surface of a carrier 160 under the patterned insulation layer is exposed.

The patterned conductive layer 130 functions as redistribution layer (RDL) to provide electrical connections. A line width and line space (L/S) in the present disclosure can be reduced to be smaller than 1/1 µm. The density of the interconnection of the semiconductor device package can be increased accordingly. In some embodiments, the patterned conductive layer 130 is formed of or includes gold (Au), silver (Ag), copper (Cu), platinum (Pt), Palladium (Pd), other metal(s) or alloy(s), or a combination of two or more thereof.

The encapsulant 150 includes an epoxy resin, a molding compound (e.g., an epoxy molding compound or other molding compound), a polyimide, a phenolic compound or material, a material including a silicone dispersed therein, or a combination of two or more thereof. In some embodiments, the encapsulant 150 may be a capillary underfill (CUF), a molded underfill (MUF) or a dispensing gel, depending on specifications of different embodiments. In some embodiments, the underfill can be omitted.

In some embodiments, the patterned insulation layer 110 has an outermost sidewall 110o is overlaid by the encapsulant 150.

Figure 7:
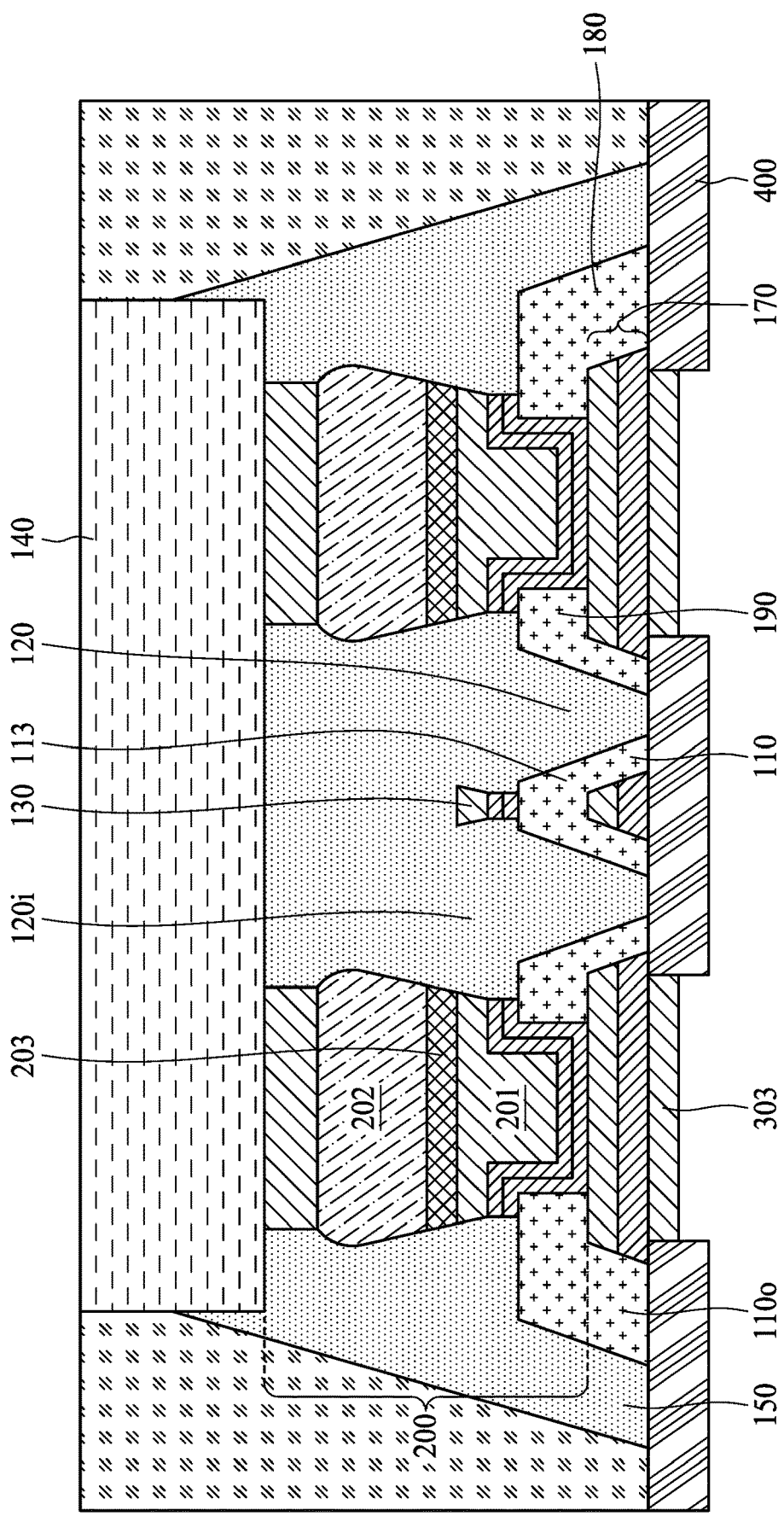
FIG. 7 illustrates a cross-sectional view of a semiconductor device package in accordance with some embodiments of the present disclosure.

Referring to FIG. 1, in some embodiments, the tapered groove 120 is filled with an insulation material 120i. Referring to FIG. 7, in some embodiments, the insulating material 120i overlays the patterned conductive layer 130 and fills into the tapered groove 120. The insulation material may include an organic material, a solder mask, a polyimide (PI), an epoxy, an Ajinomoto build-up film (ABF), one or more molding compounds, one or more pre-impregnated composite fibers (e.g., a pre-preg fiber), a borophosphosilicate glass (BPSG), a silicon oxide, a silicon nitride, a silicon oxynitride, an undoped silicate glass (USG), any combination thereof, or the like. Examples of molding compounds may include, but are not limited to, an epoxy resin including fillers dispersed therein. Examples of a pre-preg fiber may include, but are not limited to, a multi-layer structure formed by stacking or laminating one or more pre-impregnated materials or sheets. In some embodiments, the insulation material may include an inorganic material, such as silicon, a ceramic or the like.

In some embodiments, a conductive structure (also referred to as a seed layer) 170 is overlaid by the patterned insulation layer 110, and electrically connected to the fine conductive layer 130. In some embodiments, the conductive structure 170 is formed of, or includes, Titanium (Ti), gold (Au), silver (Ag), copper (Cu), platinum (Pt), Palladium (Pd), other metal(s) or alloy(s), or a combination of two or more thereof. The conductive layer functions as a redistribution layer (RDL) to provide electrical connections. In some embodiments, the conductive structure 170 comprises a Ti layer with a thickness ranging from 0.1 µm to 0.5 µm and a Cu layer with a thickness ranging from 0.1 µm to 3 µm.

In some embodiments, an insulation layer 180 is provided with a via 190 so that the semiconductor device 140 is electrically connected to the patterned conductive layer 130 on the insulation island 113 through a connection structure 200 through the via 190. The connection structure 200 is arranged on the conductive structure 170.

In some embodiments, the connection structure 200 comprises a Cu layer 201 filled in the via 190. In some embodiments, a micro-bump 202 is arranged between the semiconductor device 140 and the Cu layer 201, and a micro-bump barrier 203 is arranged between the micro-bump 202 and the Cu layer 201.

In some embodiments, the Cu layer 201 may be replaced with other metals, e.g. gold (Au), silver (Ag), platinum (Pt), Palladium (Pd), other metal(s) or alloy(s), or a combination of two or more thereof. In some embodiments, the Cu layer 201 has a thickness in a range from 1 µm to 5 µm.

In some embodiments, the micro-bump barrier 203 includes titanium (Ti), nickel (Ni), tungsten (W), other metal(s) or alloy(s), or a combination of two or more thereof.

In some embodiments, a ball pad barrier 303 is formed a side of the conductive structure 170 opposite to another side of the conductive structure 170 contacting the connection structure 200. The ball pad barrier 303 includes titanium (Ti), nickel (Ni), tungsten (W), other metal(s) or alloy(s), or a combination of two or more thereof.

Figure 8A:
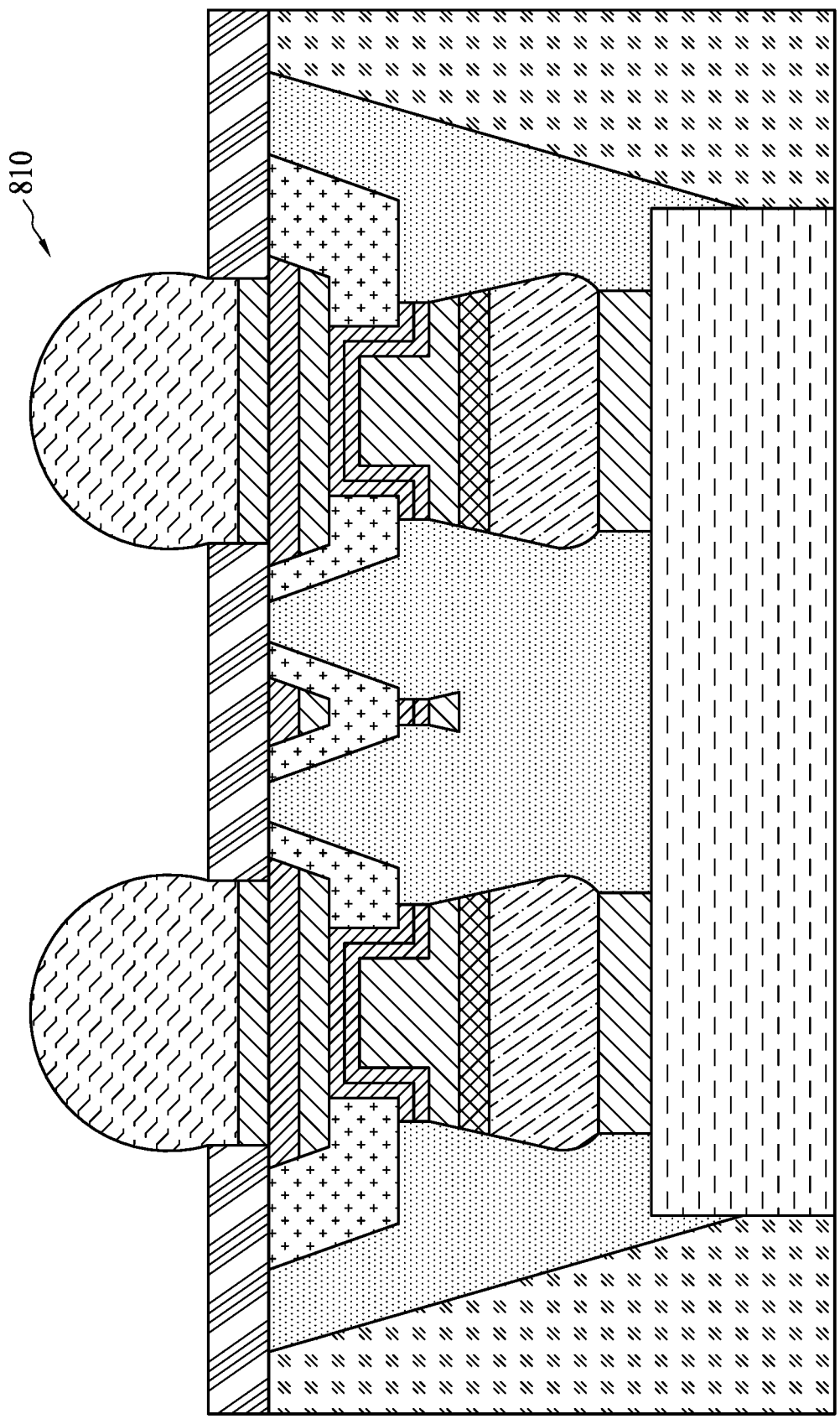
FIG. 8A illustrates a cross-sectional view of a semiconductor device package in accordance with some embodiments of the present disclosure.

Referring to FIG. 8A, in some embodiments, the semiconductor device 140 electrically connects to the external device through an electrical contact 810. The electrical contact 810 may be a controlled collapse chip connection (C4) bump, a ball grid array (BGA) or a land grid array (LGA). In some embodiments, the solder ball has a diameter in a range from 50 μm to 300 μm. In some embodiments, the C4 bump has a diameter in a range from 25 μm to 80 μm.

Figure 8B:
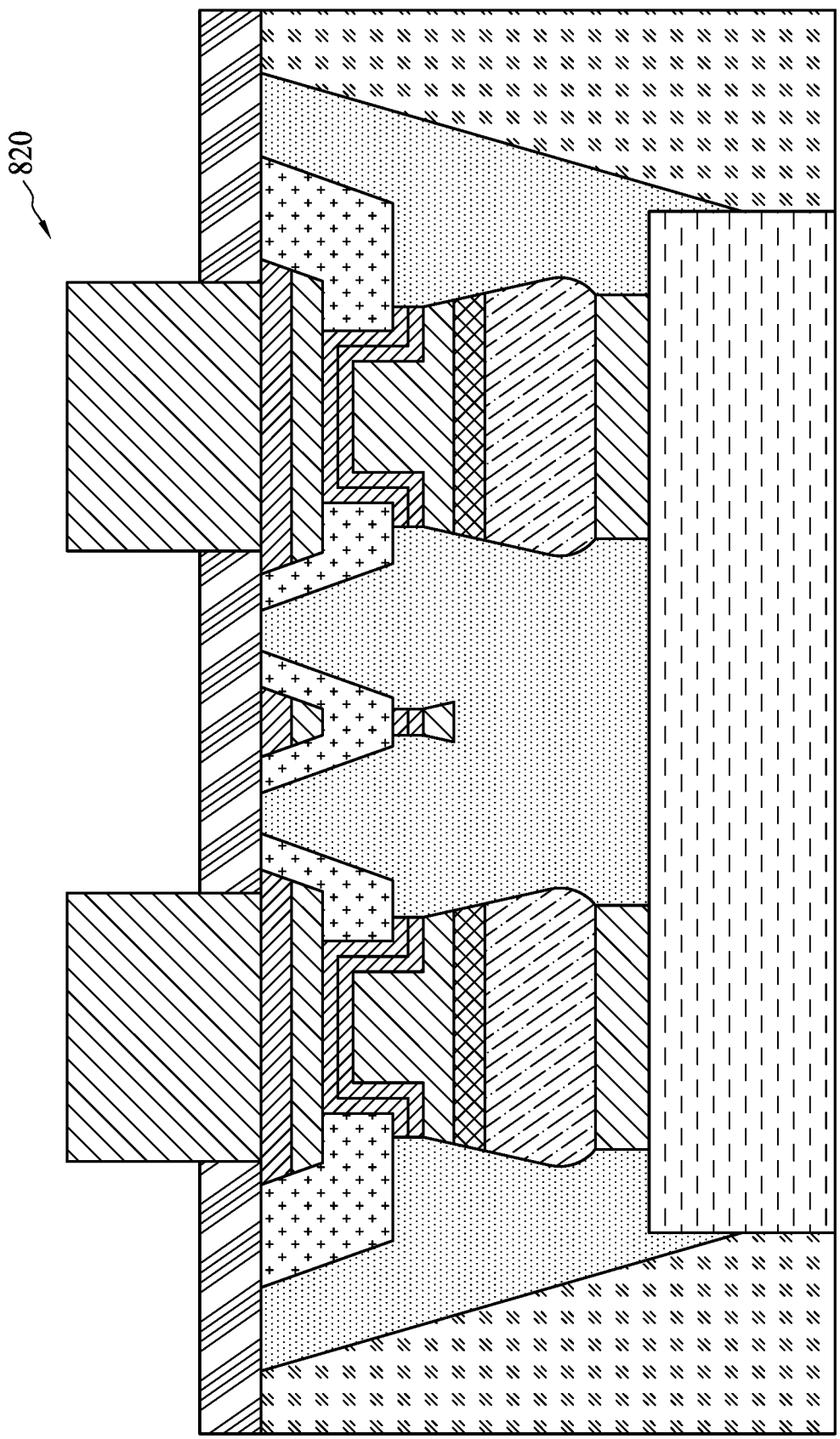
FIG. 8B illustrates a cross-sectional view of a semiconductor device package in accordance with some embodiments of the present disclosure.

Referring to FIG. 8B, in some embodiments, the semiconductor device 140 electrically connects to the external device through electrical contacts 820. The electrical contacts 820 are pillar bumps and/or stub bumps.

Figure 9A:
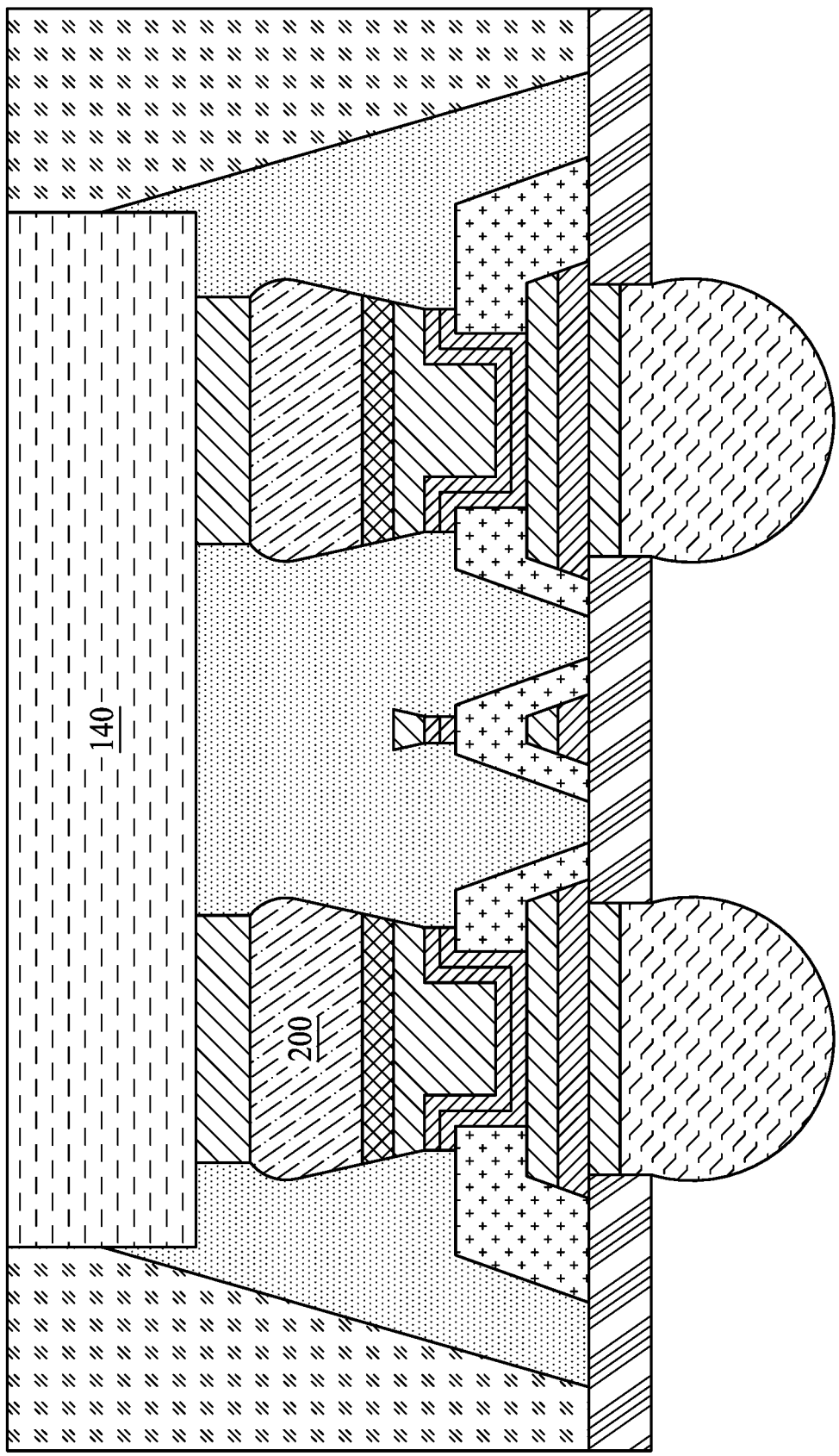
FIG. 9A illustrates a cross-sectional view of a semiconductor device package in accordance with some embodiments of the present disclosure.
Figure 9B:
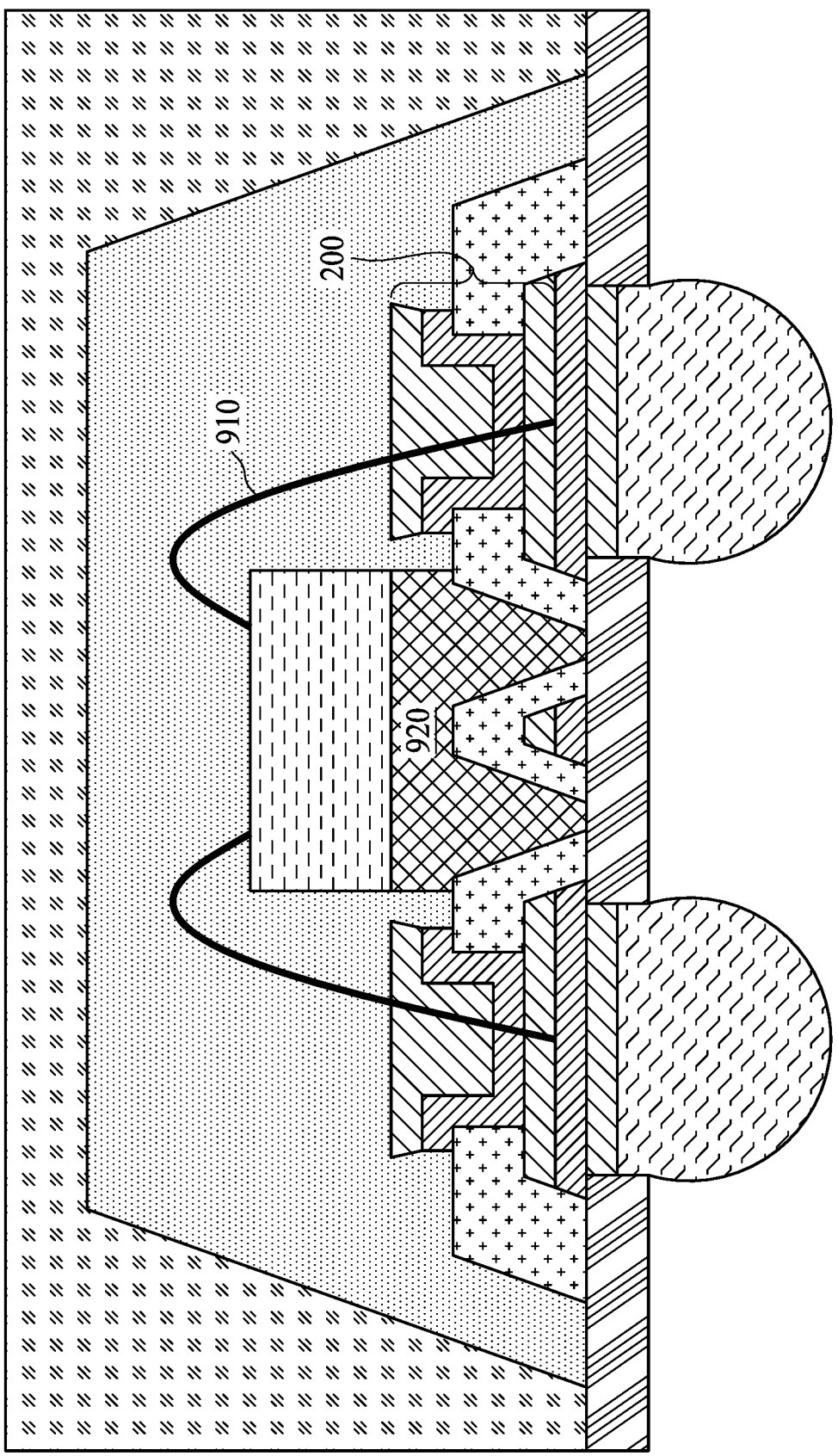
FIG. 9B illustrates a cross-sectional view of a semiconductor device package in accordance with some embodiments of the present disclosure.

Referring to FIG. 9A, in some embodiments, the semiconductor device 140 is bonded to the connection structure 200 by a flip chip technique. Referring to FIG. 9B, in some embodiments, the semiconductor device 140 electrically connects to the connection structure 200 through a bonding wire 910. In some embodiments, the tapered groove is filled with glue 920, and the glue overlays the patterned conductive structure and the insulation island.

Figure 10:
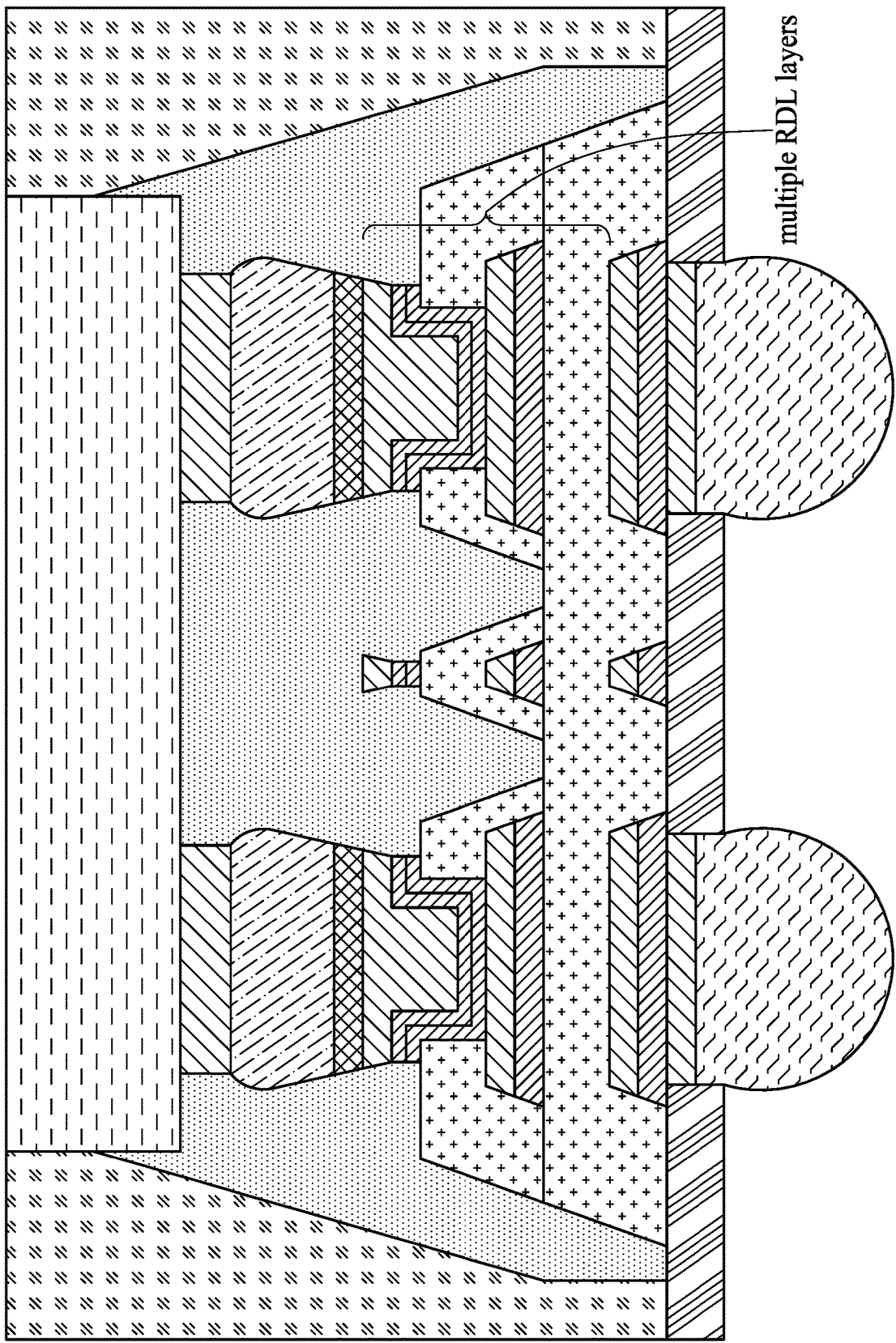
FIG. 10 illustrates a cross-sectional view of a semiconductor device package in accordance with some embodiments of the present disclosure.

Referring to FIG. 7, in some embodiments, the semiconductor device package has one RDL layer. Referring to FIG. 10, in some embodiments, the semiconductor device package has multiple RDL layers. The number of the RDL layer depends on design specifications.

Figure 11A:
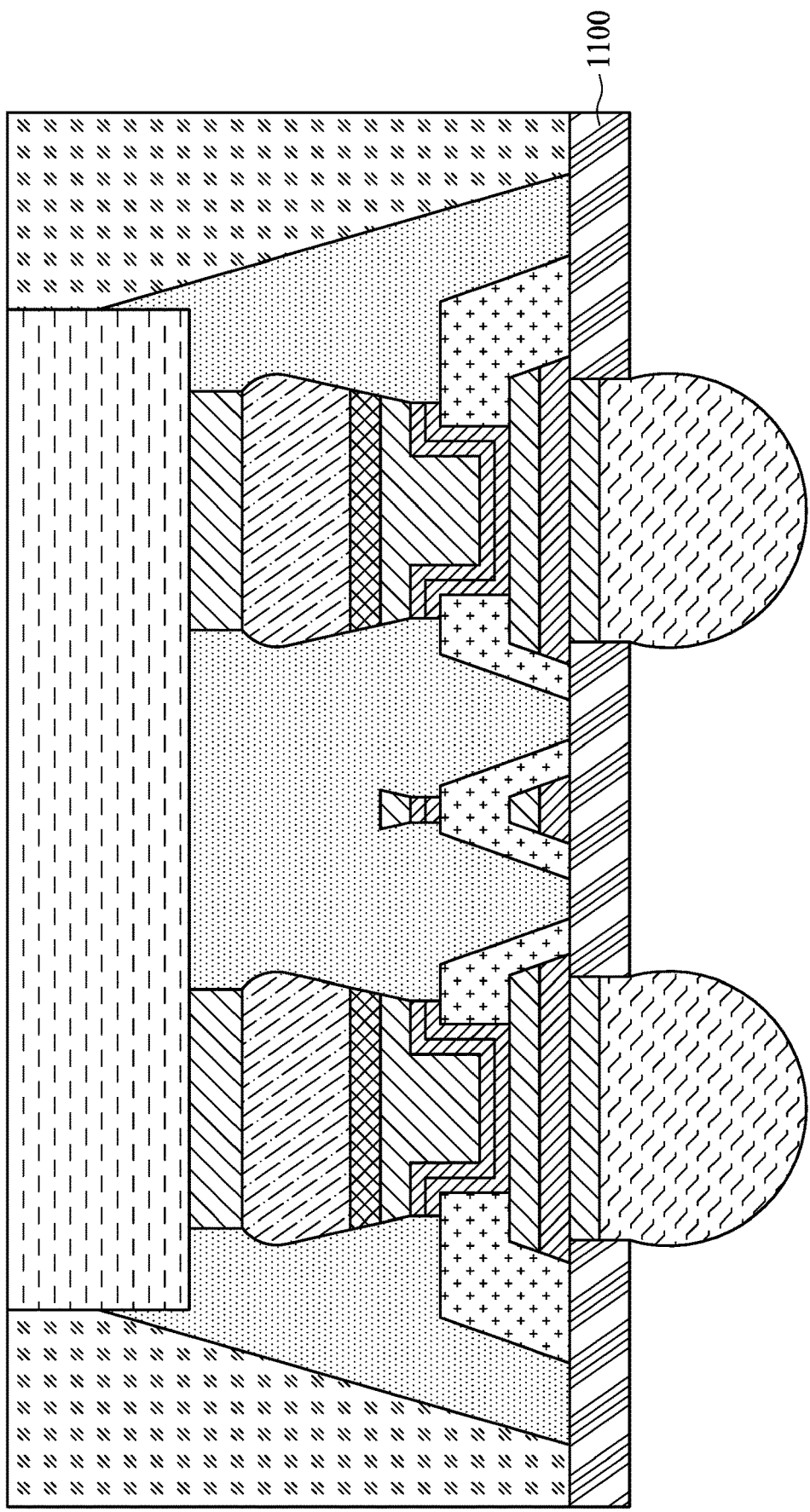
FIG. 11A illustrates a cross-sectional view of a semiconductor device package in accordance with some embodiments of the present disclosure.
Figure 11B:
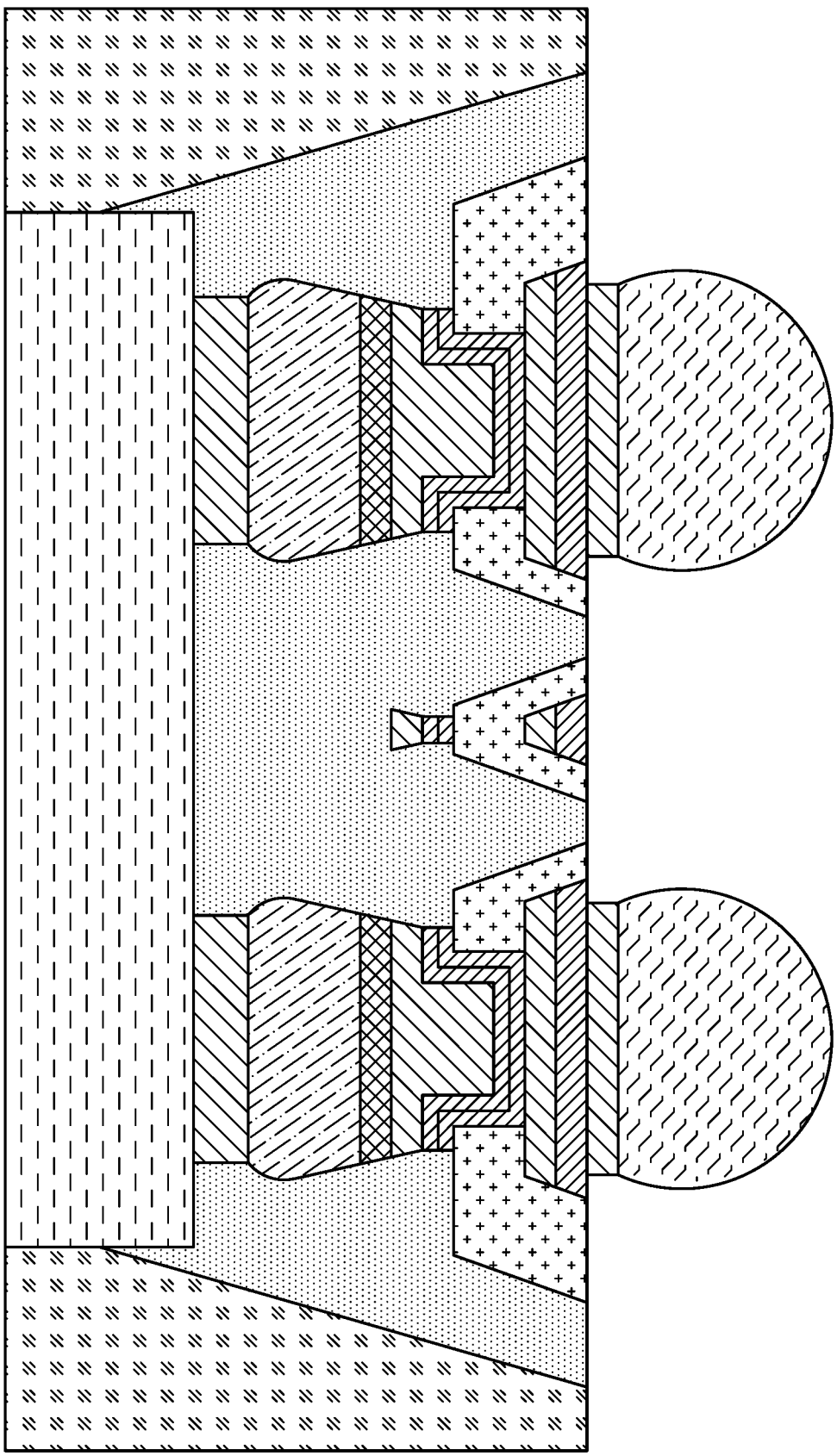
FIG. 11B illustrates a cross-sectional view of a semiconductor device package in accordance with some embodiments of the present disclosure.

Referring to FIG. 11A, in some embodiments, a dielectric layer 1100 is applied below the connection structure and the patterned insulation layer. The dielectric layer 1100 functions as a resist to protect the semiconductor device package. In some embodiments, the dielectric layer 1100 may include an organic material, a solder mask, a polyimide (PI), an epoxy, an Ajinomoto build-up film (ABF), one or more molding compounds, one or more pre-impregnated composite fibers (e.g., a pre-preg fiber), a borophosphosilicate glass (BPSG), a silicon oxide, a silicon nitride, a silicon oxynitride, an undoped silicate glass (USG), any combination thereof, or the like. Examples of molding compounds may include, but are not limited to, an epoxy resin including fillers dispersed therein. Examples of a pre-preg fiber may include, but are not limited to, a multi-layer structure formed by stacking or laminating one or more pre-impregnated materials or sheets. In some embodiments, the dielectric layer 1100 may include an inorganic material, such as silicon, a ceramic or the like. Referring to FIG. 11B, in some embodiments, no dielectric layer is applied below the connection structure and the patterned insulation layer.

Figure 11C:
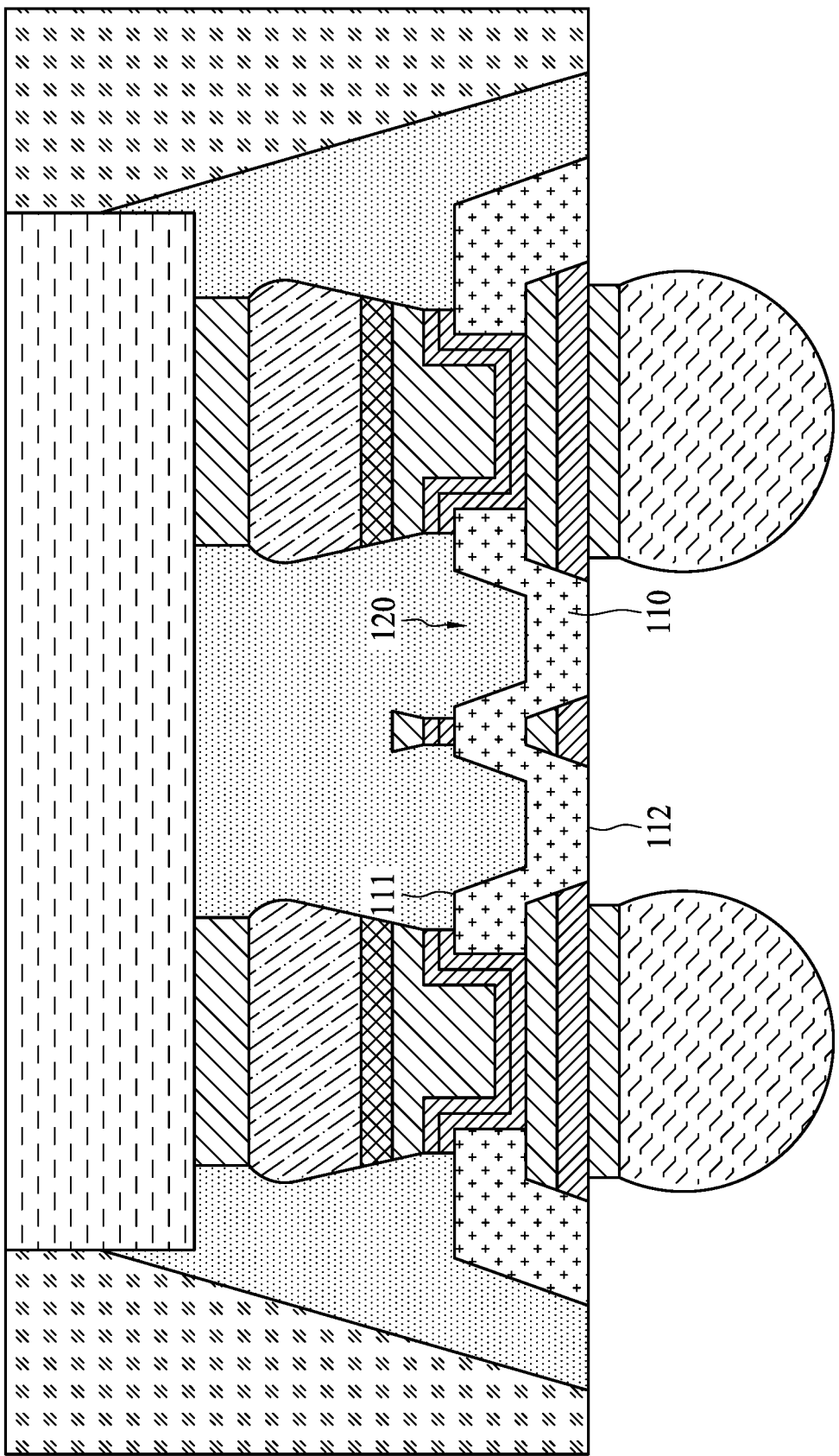
FIG. 11C illustrates a cross-sectional view of a semiconductor device package in accordance with some embodiments of the present disclosure.

Referring to FIG. 11C, in some embodiments, the tapered groove does not penetrate from the surface 111 of the patterned insulation layer 110 to the surface 112 of the patterned insulation layer 110. Each pattern of the patterned insulation layer 110 is mutually connected rather than separated from each other.

FIGS. 12A-12K are cross-sectional views of a semiconductor structure fabricated at various stages, in accordance with some embodiments of the present disclosure. At least some figures have been simplified for a better understanding of the aspects of the present disclosure.

Figure 12A:
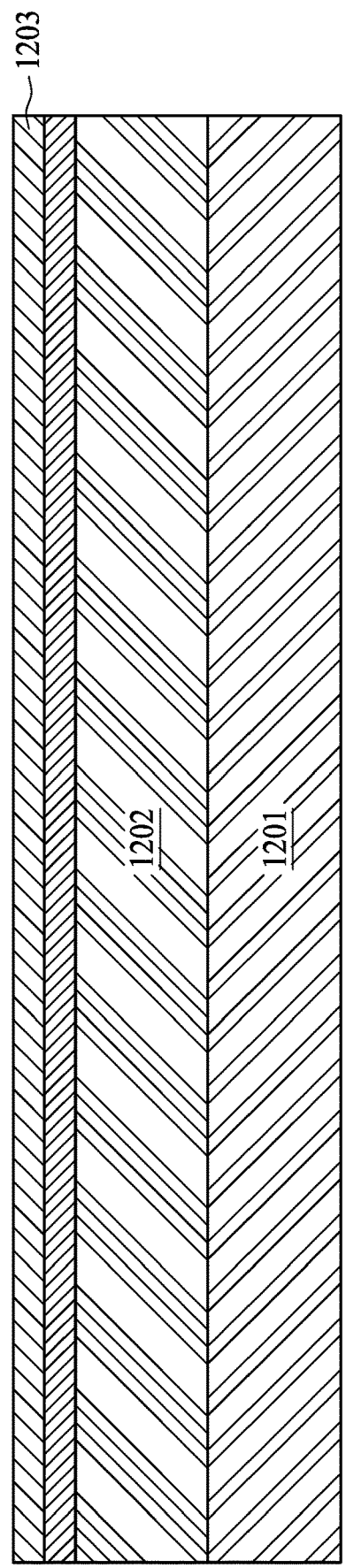

Referring to FIG. 12A, an adhesion layer (also referred to as a glue layer) 1202 is provided on a carrier 1201. The carrier 1201 may be a glass, a wafer and/or flexible carrier. The glue layer 1202 is selectively applied onto the carrier 1201. The glue layer comprises adhesion material, such as DAF. A seed layer 1203 is formed on the glue layer 1202. The seed layer is formed by sputtering, chemical vapor deposition (CVD), physical vapor deposition (PVD) or other suitable processes. The seed layer includes a Ti and Cu alloy (Ti/Cu) or other suitable materials.

Figure 12B:
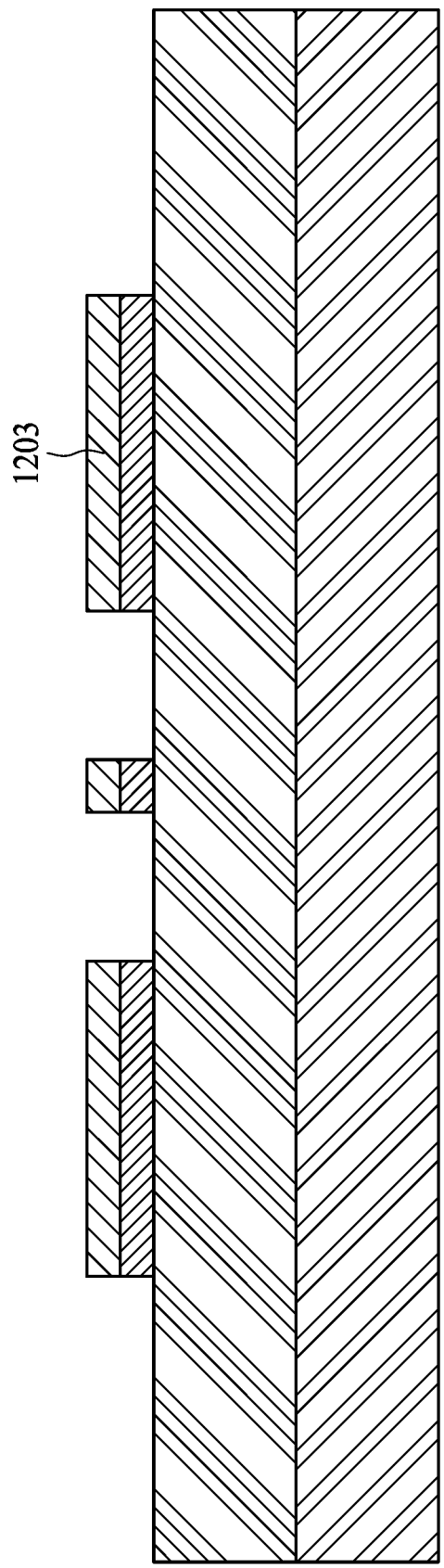

Referring to FIG. 12B, the seed layer is patterned by lithography process and etching process. The patterned seed layer is formed to be a discontinuous conductive structure.

Figure 12C:
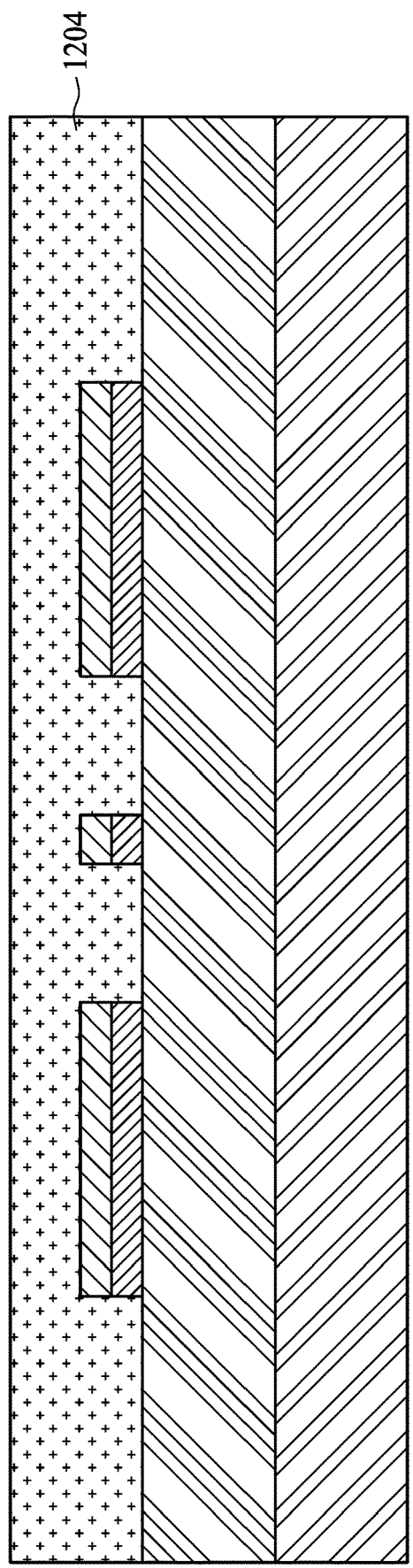

Referring to FIG. 12C, an insulation layer 1204 is formed to cover the patterned seed layer and the glue. The insulation layer 1204 may include, for example, one or more organic materials (e.g., a molding compound, bismaleimide triazine (BT), a PI, a polybenzoxazole (PBO), a solder resist, solder mask ink, an ABF, a polypropylene (PP), an epoxy-based photosensitive material, or a combination of two or more thereof), inorganic materials (e.g., silicon, $SiO_x$, $SiN_x$, $TaO_x$, glass, ceramic, quartz, or a combination of two or more thereof), a liquid-film material or a dry-film material, or a combination of two or more thereof. In some embodiments, the insulation layer 1204 has a heat shrinkage rate in a range of 80%-95%.

Figure 12D:
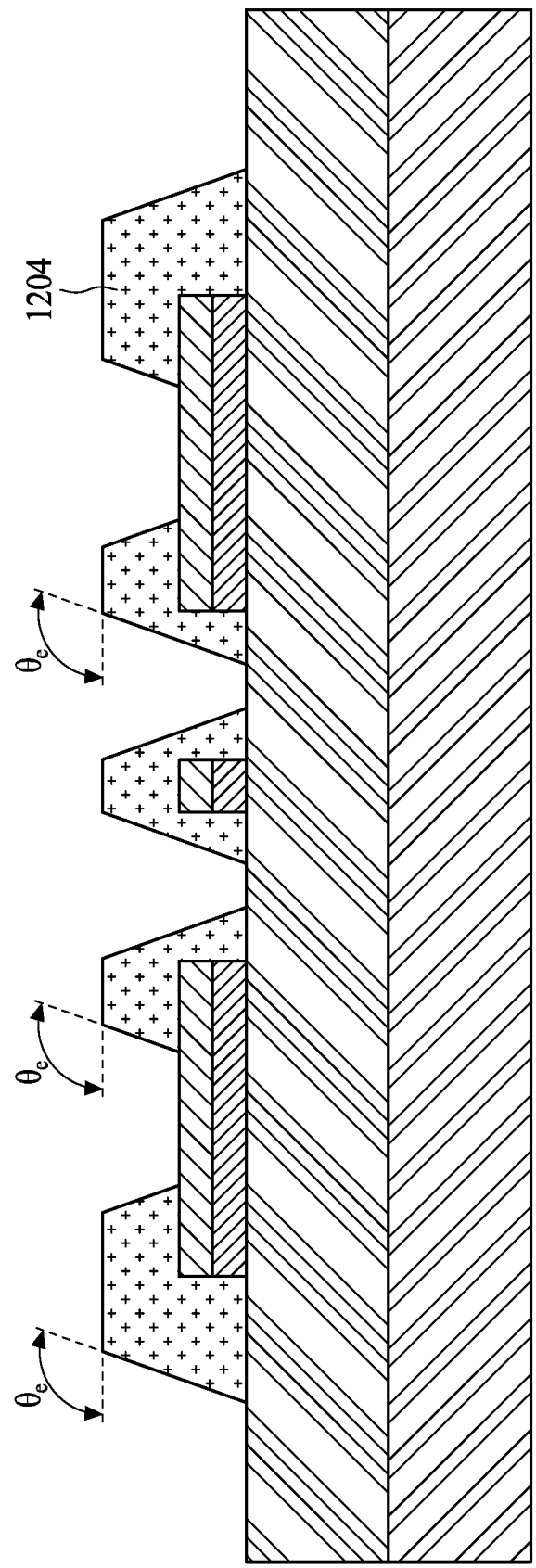

Referring to FIG. 12D, the insulation layer 1204 is patterned. The inter angle θv is defined by the top surface of the patterned insulation layer and an inner side wall (intersecting with the patterned seed layer) of the insulation layer. The outer angle θe is defined by the top surface of the patterned insulation layer and the outer side wall (away from the patterned seed layer) of the insulation layer. The inter angle θv is about equal to the outer angle θe.

Figure 12E:
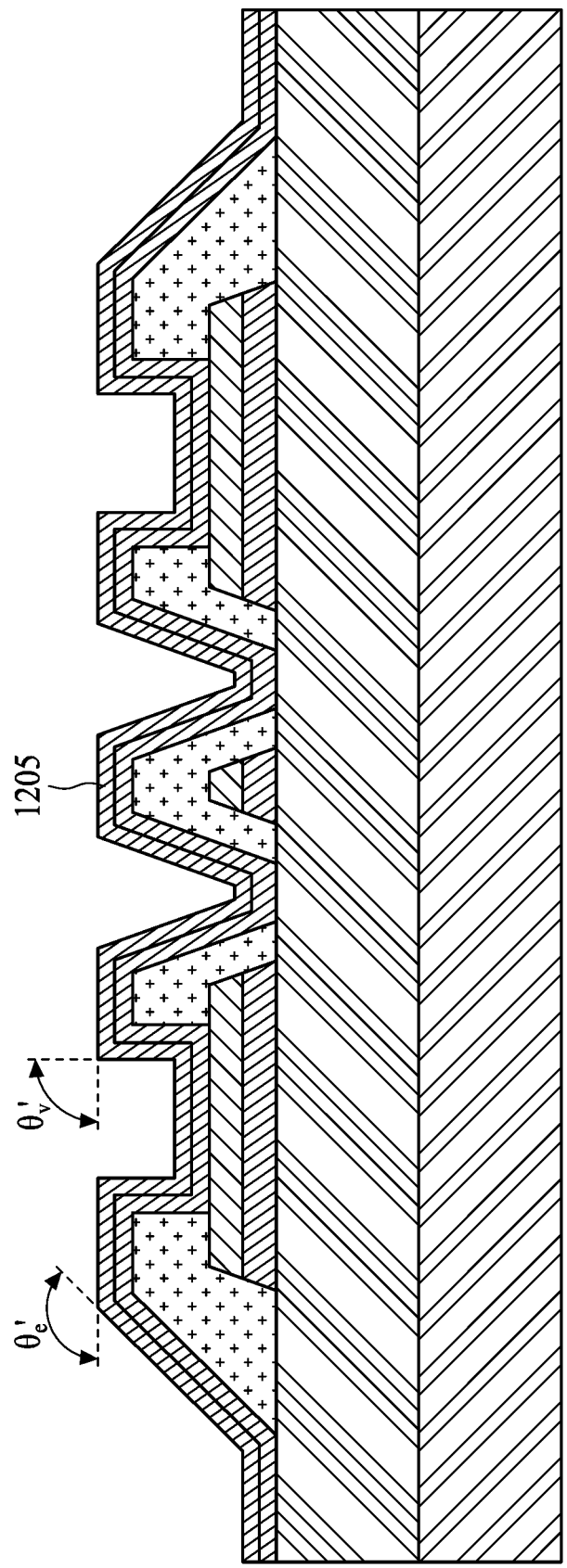

A curing process is applied, such as a thermal cycle or a UV process, to the insulation layer 1204. During the thermal cycle, the insulation layer expands while heat is applied, and the insulation layer shrinks while the temperature is cooled down. After the curing process, the patterned insulation layer is shrunk. Referring to FIG. 12E, after the curing process, the outer angle becomes θe', which is greater than the outer angle θe before the curing process. On the contrary, the inner angle becomes θv', which is less than the inner angle θv before the curing process.

Figure 12F:
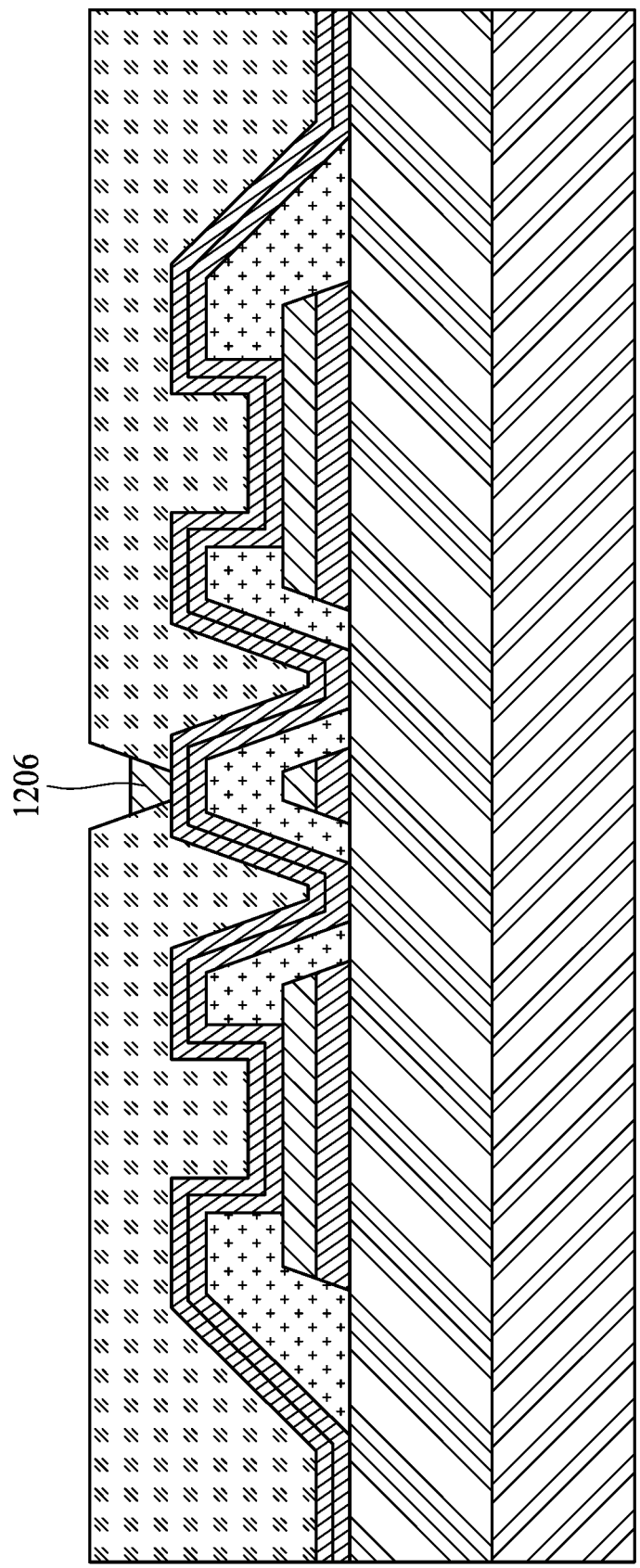

Further, a Ti seed layer 1205 is applied. Referring to FIG. 12F, a photoresist over the patterned seed layer is patterned to expose a part of the top surface of an island so as to form a hole on the island. A fine conductive structure 1206 is filled in the hole. Then the photoresist is removed. Since the layer under the fine conductive structure 1206 (the Ti seed layer) is smooth, it is unnecessary to treat the uniformity issue of the underlayer. Accordingly, the fine conductive structure 1206 can be formed to be very fine. In some embodiments, the fine conductive structure 1206 has a thickness smaller than 1 μm, and the width is smaller than 1 μm.

Figure 12G:
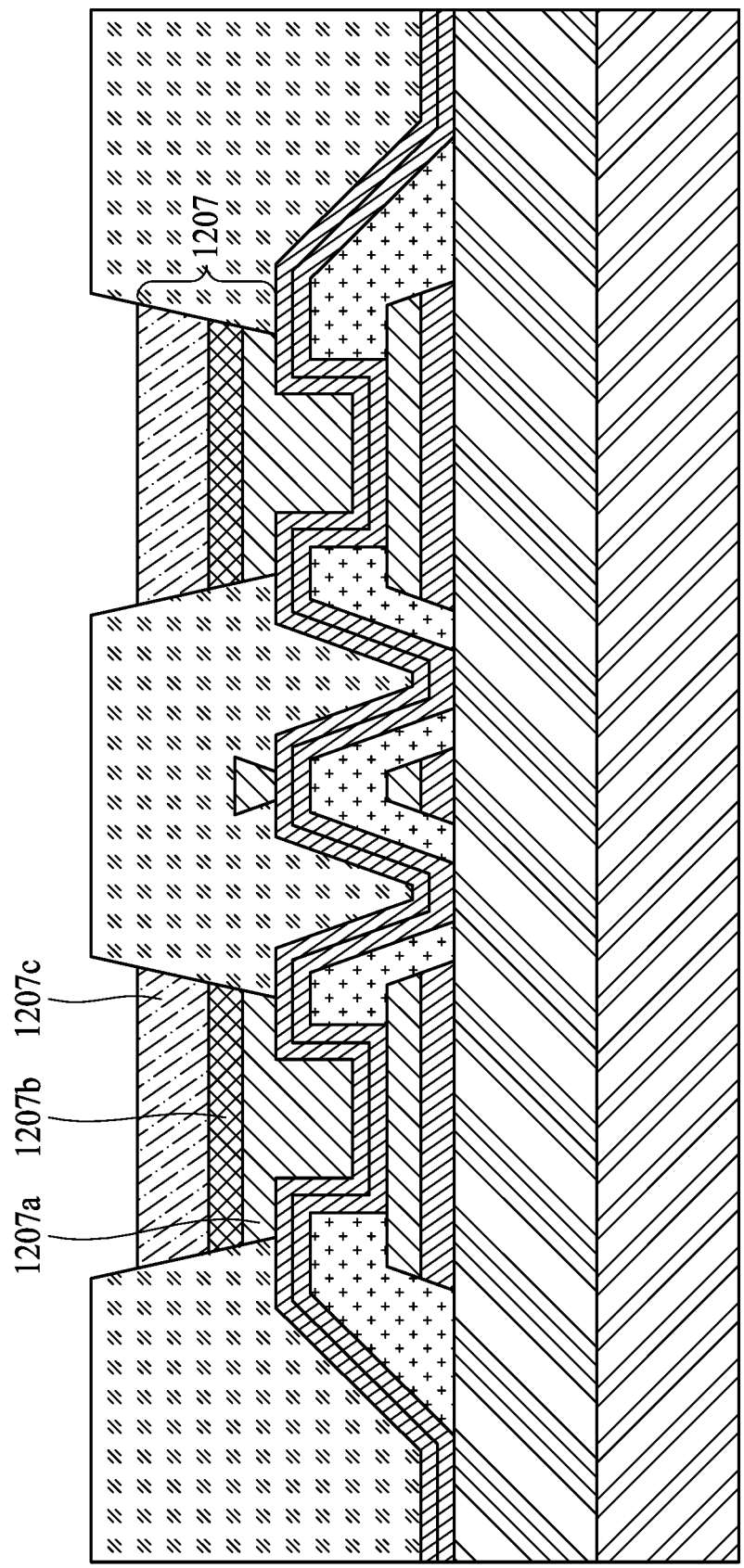

Referring to FIG. 12G, a further patterning process is applied to form holes to expose the patterned seed layer. Suit deposition process is implemented to form a conductive structure 1207. In some embodiments, the conductive structure 1207 comprises a Cu layer 1207a, a Ni layer 1207b and/or a solder layer 1207c.

The dimension of the conductive structure 1207 is larger than that of the fine conductive structure 1206. The fine conductive structure 1206 and the conductive structure 1207 are formed in respective procedures, which can facilitate the control of the deposition quality.

Figure 12H:
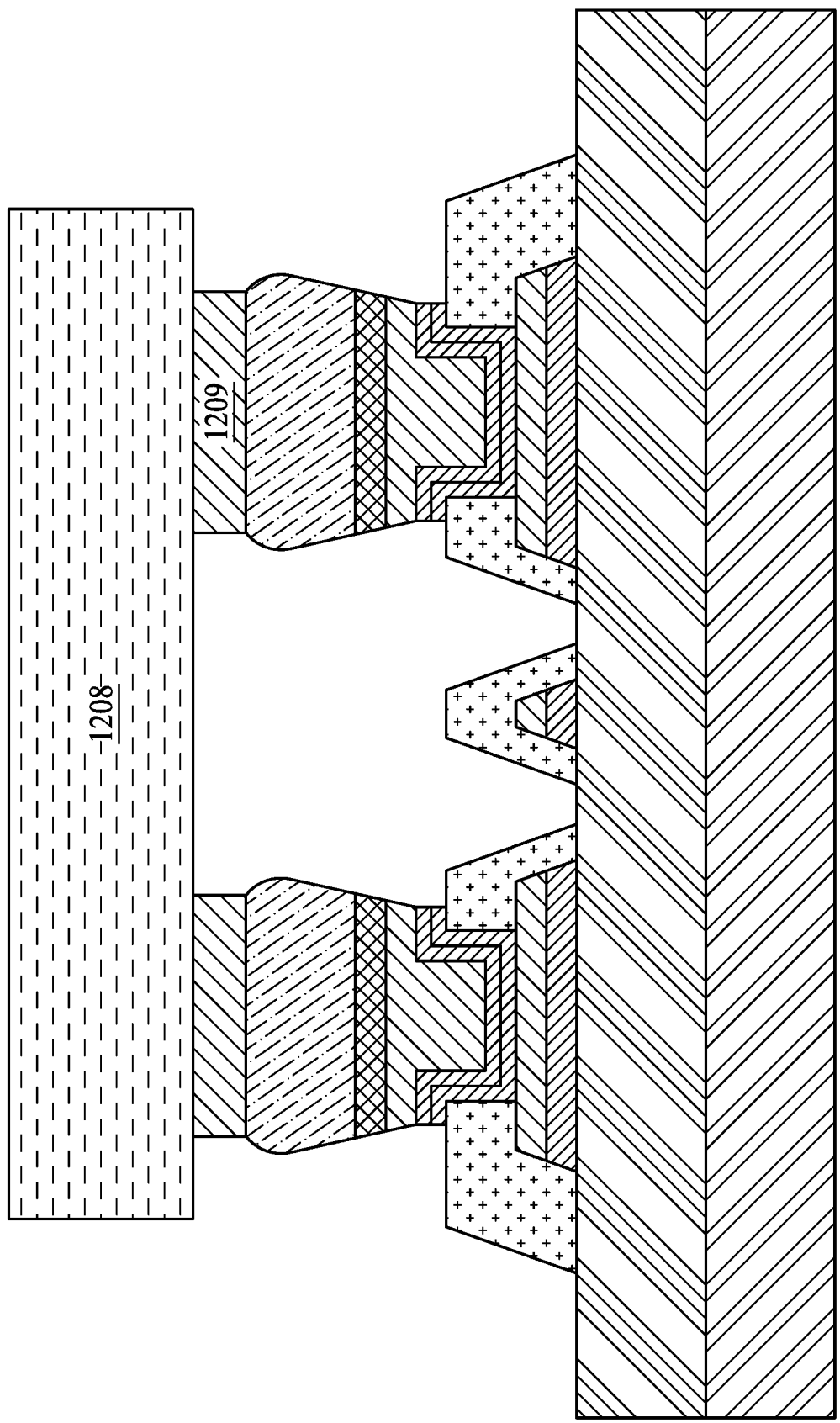

Referring to FIG. 12H, a semiconductor device 1208 is positioned on the conductive structure 1207 through a bonding process with micro-bumps 1209. In some embodiments, the micro-bumps 1209 comprise Cu.

Figure 12I:
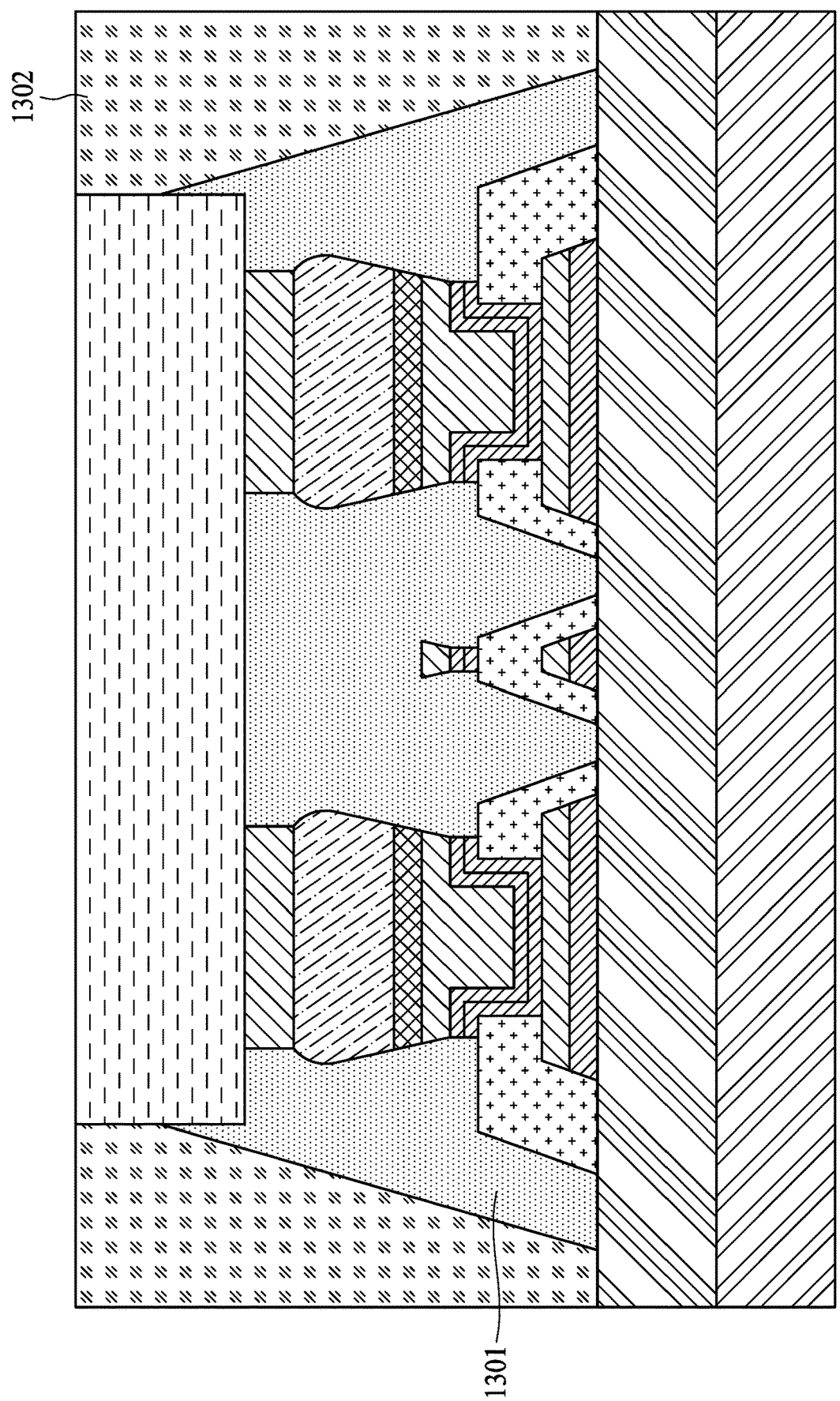

Referring to FIG. 12I, an encapsulant 1301 encapsulates the semiconductor device, the island and the patterned insulation layer to form an encapsulated structure. A molding compound 1302 is applied to the encapsulated structure.

Figure 12J:
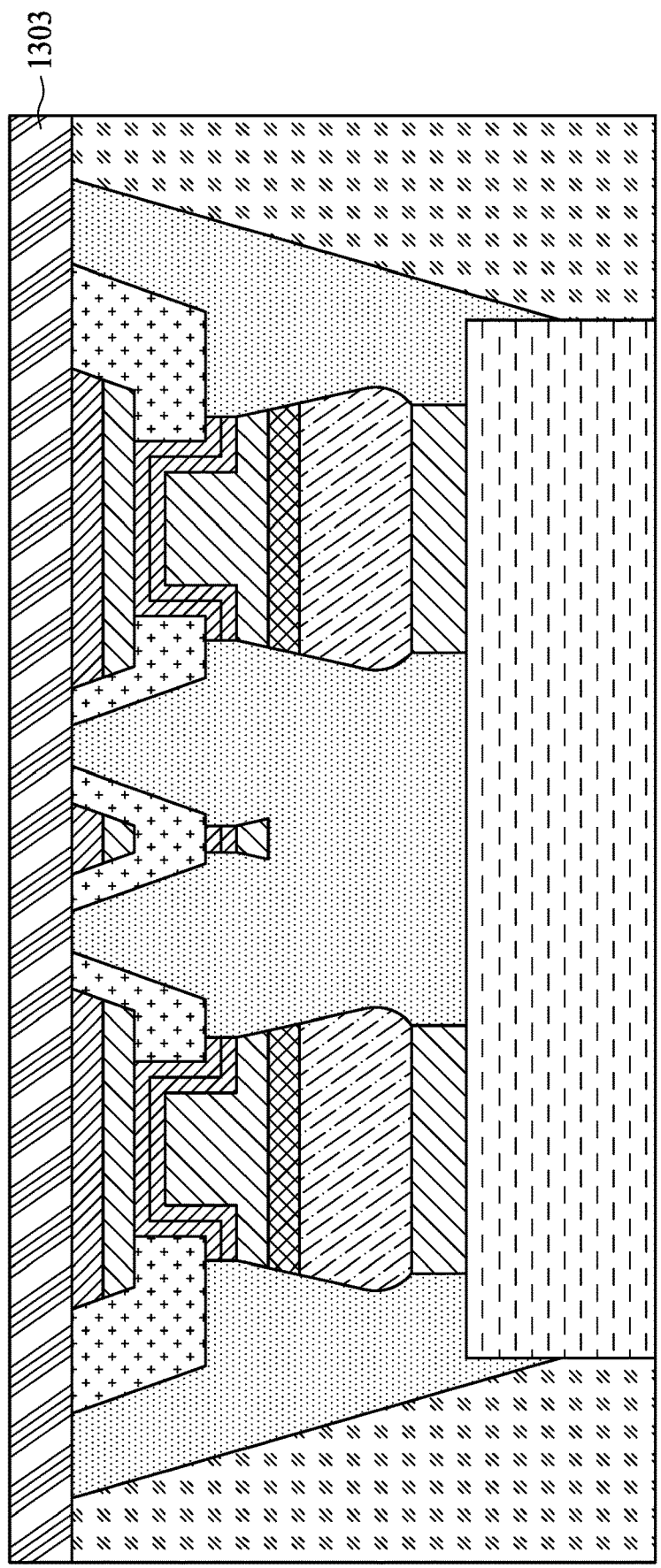

Referring to FIG. 12J, the carrier and the adhesion layer are removed, and a bottom surface of the patterned insulation layer and the seed layer are exposed. A dielectric layer 1303 is applied onto the bottom surface of the patterned insulation layer and the seed layer. In some embodiments, the thickness of the dielectric layer 1303 is in a range from 2 µm to 20 µm. In some embodiments, the dielectric layer 1303 may include an organic material, a solder mask, a polyimide (PI), an epoxy, an Ajinomoto build-up film (ABF), one or more molding compounds, one or more pre-impregnated composite fibers (e.g., a pre-preg fiber), a borophosphosilicate glass (BPSG), a silicon oxide, a silicon nitride, a silicon oxynitride, an undoped silicate glass (USG), any combination thereof, or the like. Examples of molding compounds may include, but are not limited to, an epoxy resin including fillers dispersed therein. Examples of a pre-preg fiber may include, but are not limited to, a multi-layer structure formed by stacking or laminating one or more pre-impregnated materials or sheets. In some embodiments, the dielectric layer 1303 may include an inorganic material, such as silicon, a ceramic or the like.

Figure 12K:
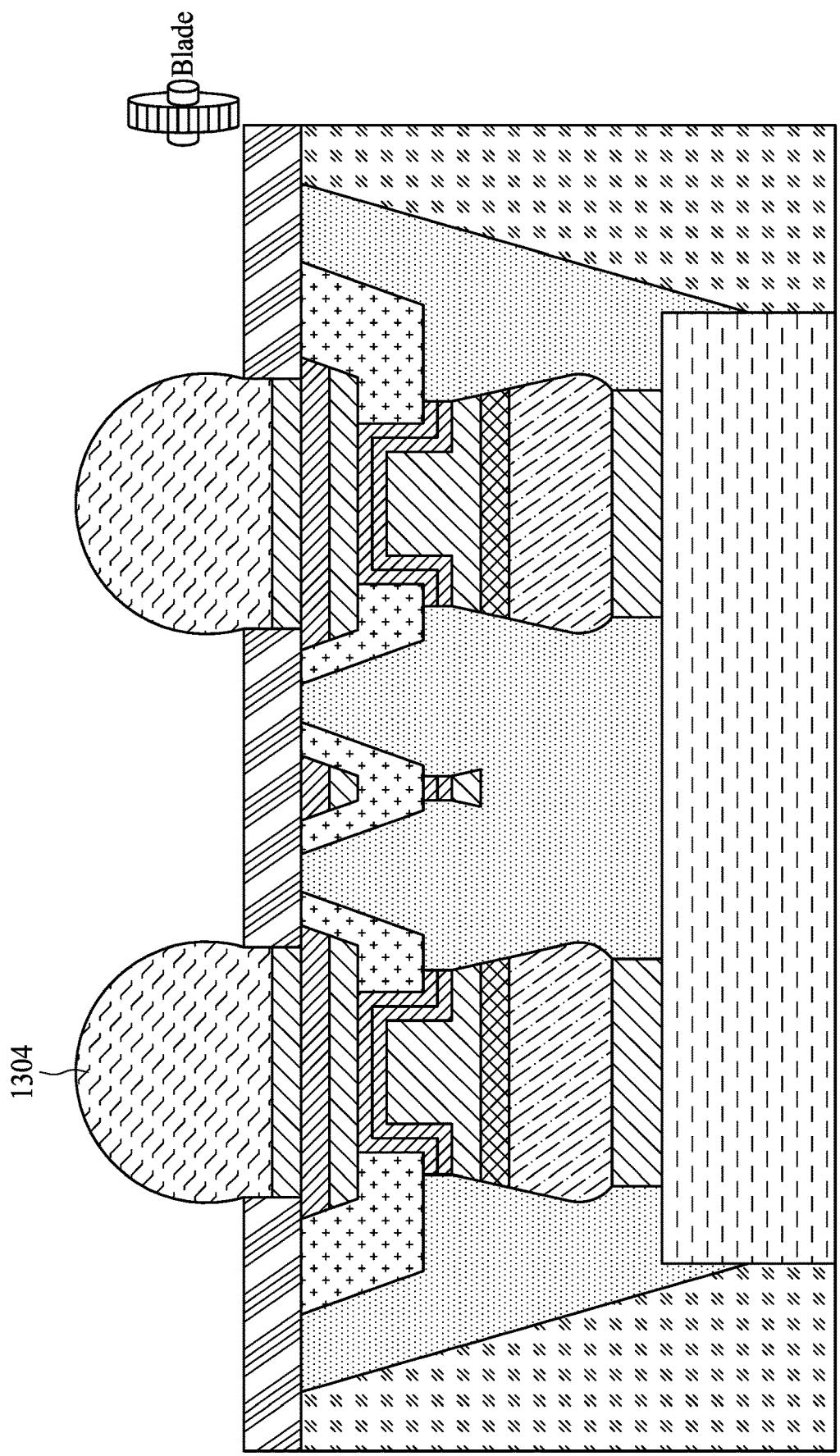

Referring to FIG. 12K, a lithography process and an etching process are applied to the dielectric layer 1303 to expose at least part of the bottom surface of the seed layer. A solder pad is formed on the exposed bottom surface of the seed layer. Further, a solder ball is formed on the solder pad. In some embodiments, the semiconductor package device shown in FIG. 12K is substantially the same as or similar to the semiconductor package device shown in FIG. 8A.

FIGS. 13A and 13B illustrate different types of semiconductor device packages in accordance with some embodiments of the present disclosure.

As shown in FIG. 13A, a plurality of semiconductor devices SD (such as chips or dies) are placed on a square-shaped carrier. In some embodiments, the carrier may include organic materials (e.g., a molding compound, BT, a PI, a PBO, a solder resist, an ABF, a PP, an epoxy-based material, or a combination of two or more thereof) or inorganic materials (e.g., silicon, a glass, a ceramic, a quartz, or a combination of two or more thereof).

As shown in FIG. 13B, a plurality of semiconductor devices SD (such as chips or dies) are placed on a circle-shaped carrier. In some embodiments, the carrier may include organic materials (e.g., a molding compound, BT, a PI, a PBO, a solder resist, an ABF, a PP, epoxy-based material, or a combination of two or more thereof) or inorganic materials (e.g., silicon, a glass, a ceramic, a quartz, or a combination of two or more thereof).

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:
1. A semiconductor packaging device, comprising:
  a first patterned insulation layer having a first surface, a second surface opposite the first surface, and comprising a first portion and an island portion having the first surface, the island portion being adjacent to the first portion, the first patterned insulation layer defining a tapered groove surrounding the island portion and disposed between the first portion and the island portion;

a patterned conductive layer disposed on the first surface of the island portion;

a connection structure penetrating the first portion of the first patterned insulation layer;

a semiconductor device electrically connected to the patterned conductive layer, the connection structure being disposed within a projection area of the semiconductor device on the first patterned insulation layer; and an encapsulant encapsulating the semiconductor device, the first patterned insulation layer and the patterned conductive layer;

wherein the tapered groove is filled with an insulation material.

2. The semiconductor packaging device of claim 1, wherein the first surface of the first patterned insulation layer comprises a first dimension (D1), and the second surface comprises a second dimension (D2), the first dimension being smaller than the second dimension.

3. The semiconductor packaging device of claim 1, wherein the patterned conductive layer disposed on the first surface of the island portion has a first width w, and a second width x of the island portion of the first patterned insulation layer is exposed to the encapsulant.

4. The semiconductor packaging device of claim 3, wherein the first patterned insulation layer comprises a thickness t, and the second surface of the first patterned insulation layer has a third width L, the first surface and a sidewall of the first patterned insulation layer defining an angle θe', wherein $$\theta_e' = \pi - \tan^{-1}(t/(L-(w+2x))/2).$$

5. The semiconductor packaging device of claim 4, wherein the angle θe'≤150°.

6. The semiconductor packaging device of claim 4, wherein 5 μm≤t≤20 μm.

7. The semiconductor packaging device of claim 3, wherein the tapered groove has a fourth width s, the first patterned insulation layer has a determined pitch p and a shrinkage amount r, s≤p−(w+2x+2r).

8. The semiconductor packaging device of claim 7, wherein s≥1 micrometers (μm).

9. The semiconductor packaging device of claim 7, wherein the value of p−(w+2x+2r) has tolerance.

10. The semiconductor packaging device of claim 3, wherein the second width x≥0.2 μm.

11. The semiconductor packaging device of claim 1, wherein the tapered groove surrounds the patterned conductive layer.

12. The semiconductor packaging device of claim 1, further comprising an insulating material overlaying the patterned conductive layer and filling into the tapered groove.

13. The semiconductor packaging device of claim 1, further comprising a conductive structure, wherein the patterned insulation layer overlays the conductive structure, and the patterned conductive layer electrically connects to the conductive structure.

14. The semiconductor packaging device of claim 1, wherein the first patterned insulation layer has an outermost sidewall overlaid by the encapsulant.

15. The semiconductor packaging device of claim 1, wherein the tapered groove penetrates from the first surface of the first patterned insulation layer to the second surface of the first patterned insulation layer.

16. The semiconductor packaging device of claim 1, wherein the encapsulant is an underfill and/or molding compound.

17. A semiconductor packaging device, comprising:
an insulation island;
an insulation wall adjacent to the insulation island, wherein the insulation island and the insulation wall defines a tapered groove surrounding the insulation island;
a patterned conductive layer on the insulation island;
a connection structure penetrating the insulation wall;
a semiconductor device electrically connected to the patterned conductive layer, the connection structure being disposed within a projection area of the semiconductor device on the insulation wall; and
an insulating material overlaying the patterned conductive layer and filling into the tapered groove.

18. The semiconductor packaging device of claim 17, wherein an encapsulant encapsulates the semiconductor device, the insulation wall and the patterned conductive layer.

19. The semiconductor packaging device of claim 18, wherein the encapsulant is an underfill and/or molding compound.

20. The semiconductor packaging device of claim 18, further comprising an outermost insulation sidewall overlaid by the encapsulant.

21. The semiconductor packaging device of claim 17, wherein the semiconductor device electrically connects to the patterned conductive layer on the insulation island through the connection structure.

22. The semiconductor packaging device of claim 21, wherein the connection structure comprises a Cu layer filled in a space defined by a via, a micro-bump arranged between the semiconductor device and the Cu layer, and a micro-bump barrier arranged between the micro-bump and the Cu layer.

23. A method for forming a semiconductor packaging device, comprising:
providing a carrier;
forming a seed layer on the carrier and patterning the seed layer;
forming a patterned insulation layer to overlay part of the seed layer, an insulation wall of the patterned insulation layer being adjacent to an insulation island of the patterned insulation layer;
curing the patterned insulation layer, a tapered groove thereby being formed to surround the insulation island;
forming a fine conductive structure on the insulation island and a connection structure penetrating the patterned insulation layer; and
arranging a semiconductor device on the connection structure electrically connected to the fine conductive structure.

* * * * *